(12) United States Patent  
Tamaso

(10) Patent No.: US 9,129,804 B2  
(45) Date of Patent: Sep. 8, 2015

(54) SILICON CARBIDE SEMICONDUCTOR DEVICE AND METHOD FOR MANUFACTURING SAME

(71) Applicant: Sumitomo Electric Industries, Ltd., Osaka-shi (JP)

(72) Inventor: Hideto Tamaso, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/167,717

(22) Filed: Jan. 29, 2014

(65) Prior Publication Data

US 2014/0170841 A1    Jun. 19, 2014

Related U.S. Application Data

(62) Division of application No. 13/388,264, filed as application No. PCT/JP2010/056694 on Apr. 14, 2010, now Pat. No. 8,674,374.

(51) Int. Cl.
*H01L 29/45* (2006.01)
*H01L 21/02* (2006.01)
(Continued)

(52) U.S. Cl.
CPC ........ *H01L 21/02529* (2013.01); *H01L 21/046* (2013.01); *H01L 21/0485* (2013.01);
(Continued)

(58) Field of Classification Search
CPC . H01L 29/1608; H01L 29/45; H01L 21/8213; H01L 2224/11848; H01L 31/0512; H01L 21/0485; H01L 28/60; H01L 21/02378; H01L 21/02447
See application file for complete search history.

(56) References Cited

U.S. PATENT DOCUMENTS 4,985,742 A * 1/1991 Pankove ................... 257/197
5,877,077 A * 3/1999 Kronlund ................. 438/602
(Continued)

FOREIGN PATENT DOCUMENTS

CN    1172551 A    2/1998
JP    01-268121    10/1989
(Continued)

OTHER PUBLICATIONS

Office Action issued in Taiwanese Patent Application No. 099112237, dated Sep. 16, 2014.
(Continued)

*Primary Examiner* — Evan Pert
*Assistant Examiner* — Gustavo Ramallo
(74) *Attorney, Agent, or Firm* — Venable LLP; Michael A. Sartori; F. Brock Riggs

(57) ABSTRACT

The present invention provides a silicon carbide semiconductor device having an ohmic electrode improved in adhesion of a wire thereto by preventing deposition of carbon so as not to form a Schottky contact, as well as a method for manufacturing such a silicon carbide semiconductor device. In the SiC semiconductor device, upon forming the ohmic electrode, a first metal layer made of one first metallic element is formed on one main surface of a SiC layer. Further, a Si layer made of Si is formed on an opposite surface of the first metal layer to its surface facing the SiC layer. The stacked structure thus formed is subjected to thermal treatment. In this way, there can be obtained a silicon carbide semiconductor device having an ohmic electrode adhered well to a wire by preventing deposition of carbon atoms on the surface layer of the electrode and formation of a Schottky contact resulting from Si and SiC.

14 Claims, 16 Drawing Sheets

(51) Int. Cl.
  *H01L 21/04* (2006.01)
  *H01L 29/06* (2006.01)
  *H01L 29/66* (2006.01)
  *H01L 29/808* (2006.01)
  *H01L 29/861* (2006.01)
  *H01L 21/283* (2006.01)
  *H01L 29/16* (2006.01)

(52) U.S. Cl.
  CPC .......... *H01L21/0495* (2013.01); *H01L 21/283* (2013.01); *H01L 29/063* (2013.01); *H01L 29/45* (2013.01); *H01L 29/6606* (2013.01); *H01L 29/66068* (2013.01); *H01L 29/808* (2013.01); *H01L 29/861* (2013.01); *H01L 29/1608* (2013.01)

(56) References Cited

U.S. PATENT DOCUMENTS

| | | | | |
|---|---|---|---|---|
| 6,410,460 | B1* | 6/2002 | Shalish et al. | 438/785 |
| 7,297,626 | B1* | 11/2007 | Cole et al. | 438/602 |
| 2004/0031971 | A1* | 2/2004 | Shimoida et al. | 257/199 |
| 2004/0145011 | A1* | 7/2004 | Hsu et al. | 257/330 |
| 2006/0006393 | A1* | 1/2006 | Ward et al. | 257/77 |
| 2007/0252171 | A1* | 11/2007 | Yamagami et al. | 257/183 |
| 2009/0221139 | A1* | 9/2009 | Yoshie | 438/590 |
| 2010/0075474 | A1* | 3/2010 | Kudou et al. | 438/197 |
| 2010/0102331 | A1* | 4/2010 | Fujikawa et al. | 257/77 |
| 2010/0244051 | A1* | 9/2010 | Ohnuma | 257/77 |
| 2012/0007104 | A1* | 1/2012 | Wada et al. | 257/77 |

FOREIGN PATENT DOCUMENTS

| | | |
|---|---|---|
| JP | 07-099169 | 4/1995 |
| JP | 2006-086183 | 3/2006 |
| JP | 2006-202883 | 8/2006 |
| JP | 2006-332358 A | 12/2006 |
| JP | 2008-117923 | 5/2008 |
| JP | 2010-016102 A | 1/2010 |
| WO | WO-96/022611 | 7/1996 |

OTHER PUBLICATIONS

International Search Report in PCT International Application No. PCT/JP2010/056694, dated Jul. 20, 2010.

Notice of Grounds of Rejection in Japanese Patent Application No. 2008-271894, dated Jul. 2, 2013.

Extended European Search Report in European Patent Application No. 10 84 9832, dated Oct. 21, 2013.

Kuchuk, et al., "Fabrication and characterization of nickel silicide ohmic contacts to n-type 4H Silicon Carbide," Journal of Physics: Conference Series 100, 2008, pp. 1-5.

Cole, et al., "Fabrication and characterization of pulse laser deposited $Ni_2Si$ Ohmic contacts on $n$-SiC for high power and high temperature device applications," Journal of Applied Physics, vol. 89, No. 8, Apr. 15, 2001, pp. 4413-4416.

Nikitina, et al., "Formation and role of graphite and nickel silicide in nickel based ohmic contacts to $n$-type silicon carbide," Journal of Applied Physics 97, 2005 American Institute of Physics.

* cited by examiner

SILICON CARBIDE SEMICONDUCTOR DEVICE AND METHOD FOR MANUFACTURING SAME

CROSS-REFERENCE TO RELATED APPLICATIONS

This application is a Divisional of U.S. patent application Ser. No. 13/388,264, filed Jan. 31, 2012, which is a National Stage of PCT International Application No. PCT/JP2010/056694, filed Apr. 14, 2010, both of which are incorporated by reference in their entirety.

TECHNICAL FIELD

The present invention relates to a silicon carbide semiconductor device and a method for manufacturing the silicon carbide semiconductor device, more particularly, a silicon carbide semiconductor device and a method for manufacturing the silicon carbide semiconductor device, by each of which adhesion is improved between an electrode and a wire.

BACKGROUND ART

Silicon carbide (SiC), one of wide gap semiconductors, is drawing attention as a material for implementing high-frequency power devices, and heat-proof, radiation-proof devices. Researches on silicon carbide semiconductor devices such as MOSFETs have been actively conducted because an oxide film ($SiO_2$) can be formed from silicon carbide using the same method as a method for forming an oxide film from silicon (Si). Further, SiC has a wider band gap and a larger dielectric breakdown electric field strength than those of Si. Thus, a semiconductor device employing SiC can achieve more excellent switching characteristics and a larger breakdown voltage than those of a semiconductor device employing Si, for example.

Generally, in such a SiC semiconductor device, a wire (pad) is provided to facilitate extraction of an electric signal from an electrode formed on a substrate thereof. Such a wire is employed in not only the SiC semiconductor device but also a Si semiconductor device in order to smoothly exchange electric signals with an external component.

FIG. 35 is a schematic cross sectional view showing a state between an electrode and a wire in a general SiC semiconductor device. As shown in FIG. 35, in a SiC semiconductor device 99A, a SiC semiconductor substrate 99 has one main surface having an electrode 98 provided thereon. In SiC semiconductor device 99A, carbon 97 may be deposited on an opposite main surface of electrode 98 to SiC semiconductor substrate 99. Here, electrode 98 is an ohmic electrode making ohmic contact with SiC semiconductor substrate 99. It should be noted that the term "main surface" refers to a surface having the largest area among flat surfaces constituting surfaces. Carbon 97 (C) thus deposited prevents a wire 96 from being directly in contact with electrode 98 in a region where carbon 97 exists, upon forming wire 96 on the opposite main surface of electrode 98 to SiC semiconductor substrate 99. Thus, carbon 97 deteriorates adhesion between electrode 98 and wire 96. This leads to a failure such as detachment of wire 96 from electrode 98, thereby affecting durability and electric characteristics of SiC semiconductor device 99A.

In order to solve the above-described problem, it is considered to utilize a structure in which an alloy layer of Ni and Si is formed on SiC substrate 95 as disclosed in Japanese Patent Laying-Open No. 7-99169 (hereinafter, referred to as "Patent Literature 1"), for example. FIG. 36 is a schematic cross sectional view showing the structure in which the alloy layer of Ni and Si is formed on a SiC semiconductor layer. Patent Literature 1 discloses that in an electronic device 95A shown in FIG. 36, Ni—Si alloy layer 94 is formed on SiC substrate 95 and is then subjected to thermal treatment to have a function as an ohmic electrode. Further, Patent Literature 1 discloses to form an ohmic electrode by providing thermal treatment to a stacked structure obtained by forming a Si layer on SiC substrate 95 and forming a Ni layer on the Si layer.

It is known that carbon 97 shown in FIG. 35 is formed in the following manner. That is, the thermal treatment in forming electrode 98 causes reaction between a metal constituting electrode 98 and SiC of SiC semiconductor substrate 99, thereby generating C (carbon) from SiC as a residue, which is then deposited on the surface of electrode 98. In view of this, in order to attain the ohmic contact, Patent Literature 1 discloses to form Ni—Si alloy layer 94, the alloy of metal (Ni) and Si, on the main surface of SiC semiconductor substrate 99, thereby forming electronic device 95A shown in FIG. 36. Patent Literature 1 also discloses to form electronic device 95A shown in FIG. 36 in the following alternative manner: a Si layer is formed on the main surface of SiC semiconductor substrate 99, a Ni layer is provided on the Si layer, and then thermal treatment is provided thereto.

Normally, reaction temperature for silicidation (alloying) of Si and a metal is lower than that of SiC and the metal. The reaction temperature of Si and the metal is considered to be lower due to the following reason. That is, for the silicidation reaction of SiC and the metal, bonds between Si and C in SiC need to be broken. On the other hand, for the silicidation reaction of Si and the metal, bonds do not need to be broken. Accordingly, energy required for the silicidation reaction between Si and the metal becomes smaller.

Accordingly, the reaction of Si and Ni proceeds at the upper side (upper surface side of SiC substrate 95 in FIG. 36) in the structure while increasing temperature to provide the thermal treatment. When the reaction of Si and Ni proceeds to complete the silicidation, silicidation resulting from the reaction of Si of SiC with Ni is prevented, thereby preventing C from being generated due to the reaction between Si of SiC and Ni. Hence, C is most unlikely to reach the uppermost surface of the structure (the uppermost surface of the Ni—Si alloy layer in FIG. 36). Accordingly, it is considered that substantially no C is deposited on the surface of the ohmic electrode.

CITATION LIST

Patent Literature

PTL 1: Japanese Patent Laying-Open No. 7-99169

SUMMARY OF INVENTION

Technical Problem

However, in the case where Ni—Si alloy layer 94 (alloy layer containing Si) or the Si layer is formed on SiC substrate 95 as disclosed in Patent Literature 1, the SiC semiconductor layer and the layer containing the Si are in direct contact with each other. In this case, the inventor has found a problem, which will be described as follows.

Generally, Si functions as a Schottky electrode for SiC. Hence, when the Si layer or the alloy layer containing Si is brought into contact with the SiC layer, Si is not alloyed as intended and may remain in contact with SiC. In this case, this portion serves as a Schottky electrode, thus affecting electric characteristics of the silicon carbide semiconductor device.

If Si is completely reacted with Ni constituting the alloy layer or the Ni layer existing on the Si layer so as to form an alloy (silicide) for example, Si and SiC do not form a Schottky electrode, thereby achieving a function as a good ohmic electrode as disclosed in Patent Literature 1. However, for example, Si not reacted is deposited when an amount of Si is excessive relative to an amount of Ni to be reacted therewith, or when there exists a region in which concentration of Si is locally high due to variation in process conditions. In the structure disclosed in Patent Literature 1, such Si deposited may be directly in contact with SiC to form a Schottky contact as described above.

The present invention has been made in view of the foregoing problem, and its object is to provide a silicon carbide semiconductor device having an ohmic electrode improved in adhesion with a wire by preventing deposition of carbon so as not to form a Schottky contact, as well as a method for manufacturing such a silicon carbide semiconductor device.

Solution to Problem

A method for manufacturing a silicon carbide semiconductor device in the present invention is a method for manufacturing a silicon carbide semiconductor device having an ohmic electrode. The method for manufacturing includes the steps of: forming a SiC layer made of silicon carbide; forming a first metal layer on one main surface of the SiC layer, the first metal layer being made of one first metallic element and containing no carbon atoms; forming a Si layer on an opposite surface of the first metal layer to its surface facing the SiC layer, the Si layer being made of silicon (Si) and containing no carbon atoms; and thermally treating the SiC layer, the first metal layer, and the Si layer with the Si layer being exposed, to form the ohmic electrode.

According to the method described above, the first metal layer is formed between the SiC layer and the Si layer, thereby preventing Si not reacted and the SiC layer from coming into direct contact with each other to form a Schottky contact. However, it is preferable that the first metallic element is constituted by one metal. Although it will be described below in detail, this is due to the following reason. That is, if the first metal layer is constituted by, for example, two metals, Si and one of the two metals of the first metal layer react with each other, i.e., reaction of two elements proceeds, depending on conditions, at the beginning of the step of thermally treating. Thereafter, depending on conditions, the reaction is changed into reaction of the three elements, i.e., Si and the two metals. This makes it difficult to achieve a reaction state as intended.

Further, when increasing temperature in the step of thermally treating, the first metal layer thus formed between the SiC layer and the Si layer preferentially reacts with the Si layer to result in alloying (silicidation). This is because the temperature for reaction between Si and the metal layer is lower than the temperature for reaction between SiC and the metal layer as described above. When the first metallic element constituting the first metal layer is completely consumed by this reaction, the reaction between SiC and the first metal layer is prevented. On the other hand, even when the metallic element in the first metal layer remains after the reaction with the Si layer, the layer in which Si of the Si layer and the metal atoms of the metal layer are alloyed (silicided) is formed at the upper portion of the first metal layer (the surface layer opposite to the SiC layer). This restrains a phenomenon of deposition of C, which is generated as a residue by reaction between the SiC layer and the first metal layer, on the surface (the surface of the layer in which Si of the Si layer and the metal atoms of the metal layer are alloyed (silicided)) of the electrode (ohmic electrode formed by the reaction between the first metal layer and the Si layer). Accordingly, adhesion of a wire to the surface layer of the ohmic electrode can be prevented from being deteriorated due to such deposition of C on the surface layer of the ohmic electrode.

It should be noted that the first metal layer (or Si layer) containing "no carbon atoms" refers to a first metal layer or a Si layer each containing substantially no carbon atoms or containing carbon atoms at a concentration of 1% or smaller in atomicity.

A method for manufacturing a silicon carbide semiconductor device in the present invention is a method for manufacturing a silicon carbide semiconductor device having an ohmic electrode. The method includes the steps of: forming a SiC layer made of silicon carbide; forming a first metal layer on one main surface of the SiC layer, the first metal layer being made of one first metallic element and containing no carbon atoms; forming a Si layer on an opposite surface of the first metal layer to its surface facing the SiC layer, the Si layer being made of silicon and containing no carbon atoms; and forming a second metal layer on an opposite surface of the Si layer to its surface facing the first metal layer, the second metal layer being made of one second metallic element and containing no carbon atoms; and thermally treating the SiC layer, the first metal layer, the Si layer, and the second metal layer with the second metal layer being exposed, to form the ohmic electrode.

In this way, depending on conditions of the step of thermally treating, a layer made of the metal constituting the second metal layer can remain on the surface (surface opposite to the surface facing the SiC layer) of the formed ohmic electrode, or a layer containing a high concentration of the metal constituting the second metal layer can be formed thereon. When a wire is connected to such a surface of the ohmic electrode, the wire and the ohmic electrode can be adhered to each other better than in the case of connecting a wire to a completely silicided surface layer of an ohmic electrode. In other words, the adhesion of the wire can be improved. It should be noted that the term "surface layer" refers to, for example, a region distant away by 10 nm or shorter from the surface of the ohmic electrode (opposite to its surface facing the SiC layer). This region preferably contains no carbon atoms.

Further, the existence of the second metal layer reduces possibility of deposition of carbon (C), which is generated due to the reaction between SiC and the first metal layer, on the surface layer of the second metal layer.

Further, a method for manufacturing a silicon carbide semiconductor device in the present invention is a method for manufacturing a silicon carbide semiconductor device having an ohmic electrode. The method for manufacturing includes the steps of: forming a SiC layer made of silicon carbide; forming a first metal layer on one main surface of the SiC layer, the first metal layer being made of one first metallic element and containing no carbon atoms; forming a Si metal layer on an opposite surface of the first metal layer to its surface facing the SiC layer, the Si metal layer being made of silicon (Si) and the one first metallic element and containing no carbon atoms; and thermally treating the SiC layer, the first metal layer, and the Si metal layer with the Si layer being exposed, to form the ohmic electrode.

According to the method described above, the first metal layer formed between the SiC layer and the Si metal layer prevents the SiC layer and Si included in the Si metal layer and not reacted, from coming into direct contact with each other to form a Schottky contact.

Further, when increasing temperature in the step of thermally treating, the first metal layer thus formed between the SiC layer and the Si metal layer preferentially reacts with Si included in the Si metal layer to result in alloying (silicidation). When the first metallic element constituting the first metal layer is completely consumed by this reaction, reaction between SiC and the first metal layer is prevented. On the other hand, even when the metallic element in the first metal layer remains after the reaction with Si of the Si metal layer, the layer in which Si of the Si metal layer and the metal atoms of the metal layer are alloyed (silicided) is formed at the upper portion of the first metal layer (surface layer adjacent to the Si metal layer). This restrains a phenomenon of deposition of C, which is generated as a residue due to the reaction between the SiC layer and the first metal layer, on the surface of the electrode (ohmic electrode formed as a result of the reaction between the first metal layer and the Si metal layer). Accordingly, adhesion of a wire to the surface layer of the ohmic electrode can be prevented from being deteriorated due to such deposition of carbon (C) on the surface layer of the ohmic electrode.

A method for manufacturing a silicon carbide semiconductor device in the present invention is a method for manufacturing a silicon carbide semiconductor device having an ohmic electrode. The method includes the steps of: forming a SiC layer made of silicon carbide; forming a first metal layer on one main surface of the SiC layer, the first metal layer being made of one first metallic element and containing no carbon atoms; forming a Si metal layer on an opposite surface of the first metal layer to its surface facing the SiC layer, the Si metal layer being made of silicon and the one first metallic element and containing no carbon atoms; forming a second metal layer on an opposite surface of the Si metal layer to its surface facing the first metal layer, the second metal layer being made of one second metallic element and containing no carbon atoms; and thermally treating the SiC layer, the first metal layer, the Si metal layer, and the second metal layer with the second metal layer being exposed, to form the ohmic electrode.

In this way, depending on conditions of the step of thermally treating, a layer made of the metal constituting the second metal layer can remain on the surface (surface opposite to the surface facing the SiC layer) of the formed ohmic electrode, or a layer containing a high concentration of the metal constituting the second metal layer can be formed thereon. When a wire is connected to such a surface of the ohmic electrode, the wire and the ohmic electrode can be adhered to each other better than in the case of connecting a wire to a completely silicided surface layer of an ohmic electrode. In other words, the adhesion of the wire can be improved more.

In the method for manufacturing the silicon carbide semiconductor device according to the present invention, in the step of thermally treating, a carbon-containing silicide layer made of an alloy of the one first metallic element and silicon (Si) and containing carbon atoms may be formed on the one main surface of the SiC layer. Here, SiC of the SiC layer is in contact with the first metal layer. Hence, silicidation takes place by reaction thereof with the first metal layer upon increasing the temperature in thermally heating. The silicide layer thus obtained by the reaction between SiC and the first metal layer contains C from SiC. As a result, the carbon-containing silicide layer containing the carbon atoms is formed.

However, so far as C generated in course of the above-described silicidation does not exist on the surface layer of the stacked structure (the outermost surface of the formed ohmic electrode in this case), there occurs no problem in connecting a wire onto the surface layer of the ohmic electrode. Hence, the carbon-containing silicide layer made of the alloy of the one first metallic element and Si and containing carbon atoms may be formed on the one main surface of the SiC layer.

In order to form a good ohmic contact, the first metallic element is preferably one element selected from a group consisting of nickel (Ni), titanium (Ti), aluminum (Al), platinum (Pt), tungsten (W), and palladium (Pd). Further, the second metallic element is preferably one element selected from a group consisting of titanium (Ti), aluminum (Al), and chromium (Cr). When the second metallic element is one of the above-described elements, adhesion between the ohmic electrode and the wire can be improved securely.

A silicon carbide semiconductor device according to the present invention is a silicon carbide semiconductor device that can be manufactured using the method for manufacturing the silicon carbide semiconductor device in the present invention. The silicon carbide semiconductor device includes: a SiC layer made of silicon carbide; and a silicide layer disposed on one main surface of the SiC layer, made of an alloy of one first metallic element and silicon (Si), and containing no carbon atoms at its surface layer opposite to its surface facing the SiC layer. The SiC layer and the silicide layer are in ohmic contact with each other. The surface layer of the silicide layer has an upper surface exposed to allow a wire to be connected thereto.

In this way, the surface layer of the silicide layer serving as the ohmic electrode contains no carbon atoms. Accordingly, upon connecting a wire onto the surface of the silicide layer, adhesion between the silicide layer (ohmic electrode) and the wire can be prevented from being deteriorated due to existence of such carbon atoms.

It should be noted that the silicide layer containing "no carbon atoms" refers to a silicide layer containing substantially no carbon atoms, or a silicide layer containing carbon atoms at a concentration of 1% or less in atomicity. Further, the term "surface layer" refers to a region distant away by 10 nm or shorter from the surface of the silicide layer.

Further, a silicon carbide semiconductor device according to the present invention includes: a SiC layer made of silicon carbide; a carbon-containing silicide layer; and a silicide layer containing no carbon atoms. The carbon-containing silicide layer is disposed on one main surface of the SiC layer, is made of an alloy of one first metallic element and silicon (Si), and contains carbon atoms. The silicide layer containing no carbon atoms is disposed on an opposite main surface of the carbon-containing silicide layer to its surface facing the SiC layer, is made of an alloy of the one first metallic element and Si, and contains no carbon atoms at its surface layer opposite to its surface facing the carbon-containing silicide layer. The SiC layer and the carbon-containing silicide layer are in ohmic contact with each other. The surface layer of the silicide layer containing no carbon atoms at the surface layer has an upper surface exposed to allow a wire to be connected thereto.

In this way, no carbon atoms are included in the surface layer of the silicide layer that contains no carbon atoms and that is connected to the carbon-containing silicide layer serving as the ohmic electrode. Accordingly, when connecting a wire onto the surface of the silicide layer, adhesion between the silicide layer and the wire can be prevented from being deteriorated due to existence of such carbon atoms.

Further, a silicon carbide semiconductor device according to the present invention includes: a SiC layer made of silicon carbide; a silicide layer containing no carbon atoms at its surface layer; and an upper silicide layer. The silicide layer containing no carbon atoms at its surface layer is disposed on one main surface of the SiC layer, is made of an alloy of one first metallic element and silicon, and contains no carbon atoms at its surface layer opposite to its surface facing the SiC layer. The upper silicide layer is formed on the surface layer of the silicide layer containing no carbon atoms at its surface layer, is made of an alloy of one second metallic element and Si, and containing no carbon atoms at its surface layer opposite to its surface facing the silicide layer. The SiC layer and the silicide layer containing no carbon atoms at its surface layer are in ohmic contact with each other. The surface layer of the upper silicide layer has an upper surface exposed to allow a wire to be connected thereto. Further, a silicon carbide semiconductor device according to the present invention includes: a SiC layer made of silicon carbide; a carbon-containing silicide layer; a silicide layer containing no carbon atoms at its surface layer; and an upper silicide layer. The carbon-containing silicide layer is disposed on one main surface of the SiC layer, is made of an alloy of one first metallic element and silicon, and contains carbon atoms. The silicide layer containing no carbon atoms at its surface layer is disposed on an opposite main surface of the carbon-containing silicide layer to its surface facing the SiC layer, is made of an alloy of the one first metallic element and silicon, and contains no carbon atoms at its surface layer opposite to its surface facing the carbon-containing silicide layer. The upper silicide layer is formed on the surface layer of the silicide layer containing no carbon atoms at its surface layer, is made of an alloy of one second metallic element and silicon, and contains no carbon atoms at its surface layer opposite to its surface facing the silicide layer. The SiC layer and the carbon-containing silicide layer are ohmic contact with each other. The surface layer of the upper silicide layer has an upper surface exposed to allow a wire to be connected thereto.

In this case, the second metallic element can be selected independently of the first metallic element constituting the silicide layer, thereby improving a degree of freedom in selection upon selecting, as the second metallic element, a metallic element capable of improving adhesion of a wire to the surface of the upper silicide layer in connecting the wire thereto.

In the silicon carbide semiconductor device according to the present invention, the first metallic element is preferably one element selected from a group consisting of nickel, titanium, aluminum, platinum, tungsten, and palladium. In this case, a good ohmic contact can be attained between the SiC layer and the silicide layer. Further, the second metallic element is preferably one element selected from a group consisting of titanium, aluminum, and chromium. When the second metallic element is one of the above-described elements, the adhesion between the upper silicide layer (ohmic electrode) and the wire can be improved securely.

Advantageous Effects of Invention

The present invention can provide a silicon carbide semiconductor device improved in adhesion of a wire by preventing deposition of carbon so as not to form a Schottky contact, as well as a method for manufacturing such a silicon carbide semiconductor device.

DESCRIPTION OF EMBODIMENTS

Figure 1:
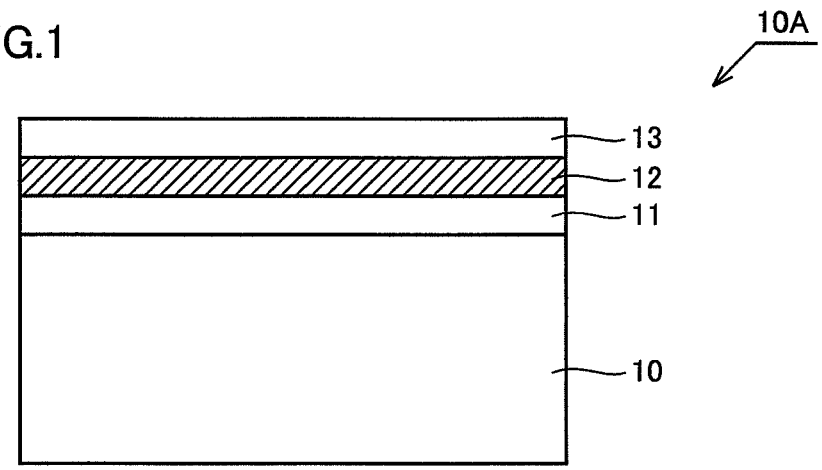
FIG. 1 is a schematic cross sectional view showing a stacked structure for forming an ohmic electrode of a silicon carbide semiconductor device according to a first embodiment of the present invention.

The following describes embodiments of the present invention with reference to figures. It should be noted that portions having the same function are given the reference characters in the embodiments, and are not described repeatedly unless required particularly.

(First Embodiment)

Figure 2:
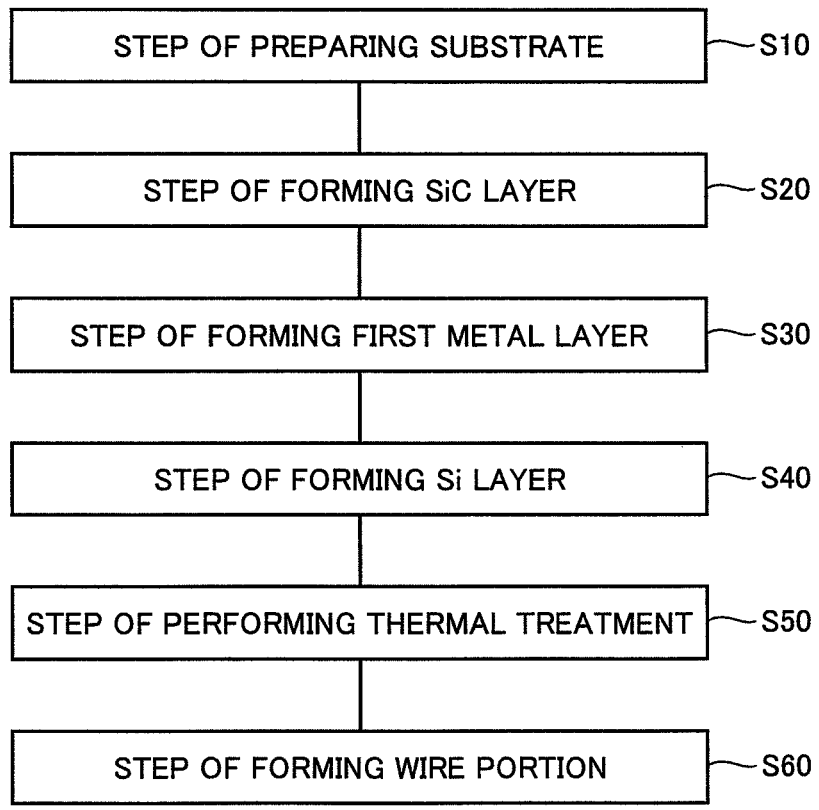
FIG. 2 is a flowchart showing a procedure for forming the silicon carbide semiconductor device according to the first embodiment of the present invention.

FIG. 1 is a schematic cross sectional view showing a stacked structure for forming an ohmic electrode of a silicon carbide semiconductor device according to a first embodiment of the present invention. FIG. 2 is a flowchart showing a procedure for forming the silicon carbide semiconductor device according to the first embodiment of the present invention. Here, stacked structure 10A shown in FIG. 1 represents a stacked structure used to form the silicon carbide semiconductor device according to the first embodiment of the present invention and having not been subjected to thermal treatment yet.

In stacked structure 10A shown in FIG. 1, in order to form the ohmic electrode of the silicon carbide semiconductor device according to the first embodiment of the present invention, a SiC layer 11 made of silicon carbide is formed on one main surface of SiC substrate 10. On one main surface of SiC layer 11, a first metal layer 12 is formed which is made of one first metallic element. Further, a Si layer 13 made of Si is formed on the first metal layer at its surface (upper side in FIG. 1) opposite to the surface thereof facing SiC layer 11.

With such a configuration, when providing thermal treatment to stacked structure 10A, the first metallic element constituting first metal layer 12 preferentially reacts with Si of Si layer 13 which has a reaction temperature relatively lower than Si of SiC layer 11, thereby resulting in alloying (silicidation) thereof. As such, the thermal treatment causes reaction between Si layer 13 and first metal layer 12 to result in silicidation. Further, when increasing temperature for the thermal treatment to reach the temperature for reaction between first metal layer 12 and Si of SiC layer 11, the first metallic element reacts with Si of SiC layer 11 to start silicidation. On this occasion, Si of the SiC and the first metallic element reacts with each other, with the result that remaining carbon (C) is accumulated as a residue. If this carbon is deposited on, for example, the surface layer (uppermost surface in FIG. 1) of stacked structure 10A, adhesion between a material of a wire and the surface layer of stacked structure 10A is deteriorated upon connecting the wire onto the surface layer of stacked structure 10A. This may result in a phenomenon such as detachment of the wire. However, when all the first metallic element is consumed by the reaction between Si of Si layer 13 and the first metallic element before C generated is deposited on the surface layer of stacked structure 10A, the first metallic element to react with SiC of SiC layer 11 ceases to exist. This can prevent reaction between SiC and the first metallic element, thereby preventing generation of C which would affect the adhesion of the wire.

Further, in stacked structure 10A, at the upper region of first metal layer 12 (region near Si layer 13), Si of Si layer 13 is silicided at least before the silicidation of SiC, whereby a silicide layer of the first metallic element and Si is formed earlier than a silicide layer of the first metallic element and SiC. Accordingly, the silicide layer formed due to the reaction of the first metallic element of first metal layer 12 and the SiC of SiC layer 11 is less likely to reach the upper end portion of first metal layer 12. Accordingly, even if C generated as a result of reaction of a part of the SiC with first metal layer 12 is accumulated in stacked structure 10A, the C is unlikely to reach the surface layer of stacked structure 10A. From this, it can be said that C can be prevented from being deposited on the surface layer of stacked structure 10A by providing first metal layer 12 between SiC layer 11 and Si layer 13.

Further, as described above, Si serves as a Schottky electrode for SiC. Hence, it is not preferable to bring the Si layer or alloy layer containing Si into direct contact with the SiC layer. However, by providing first metal layer 12 between SiC layer 11 and Si layer 13 in stacked structure 10A, SiC of SiC layer 11 and Si of Si layer 13 are not in direct contact with each other, thereby preventing formation of a Schottky contact.

Namely, as described above, the first metallic element of first metal layer 12 in direct contact with SiC layer 11 and Si layer 13 preferentially reacts with Si of Si layer 13 having a lower reaction temperature, thereby resulting in alloying (silicidation) thereof. When the reaction between Si layer 13 and first metal layer 12 is completed and the silicidation is attained before Si of Si layer 13 reaches SiC layer 11 by going beyond the region corresponding to first metal layer 12 in stacked structure 10A before the thermal treatment, Si not contributing to the silicidation and SiC of SiC layer 11 are very unlikely to be brought into direct contact with each other to form a Schottky contact. As such, by providing first metal layer 12 therebetween, a Schottky contact is less likely to be formed.

However, for example, if first metal layer 12 is constituted by two first metallic elements, reaction of the three elements including Si takes place upon the thermal treatment. For example, assuming that the heating is performed while employing three elements of a metal A, a metal B, and Si, reaction of the three elements, i.e., metal A, metal B, and Si, takes place if a reaction temperature of metal A and metal B and a reaction temperature of metal B and Si is close to each other. Further, there may be a case where at the initial state, for example, Si is in direct contact only with metal A and is not in direct contact with metal B. In such a case, it is considered that at the initial state, reaction of the two elements, i.e., metal A and Si takes place, and then as the reaction proceeds, the reaction is changed into reaction of the three elements, i.e., metal A, metal B, and Si. In the case of such reaction, it is difficult to estimate the reaction using, for example, a phase diagram to achieve an intended reaction state.

Due to the matter above, it is preferable that the first metallic element constituting the first metal layer 12 is constituted by one metal. Specifically, the first metallic element is preferably one element selected from a group consisting of nickel, titanium, aluminum, platinum, tungsten, and palladium. With this, in accordance with a correlation in work function of SiC and Si, a good ohmic electrode can be formed upon providing thermal treatment to stacked structure 10A.

Referring to FIG. 2, the following describes a method for manufacturing the silicon carbide semiconductor device according to the first embodiment of the present invention. First, a step (S10) of preparing a substrate is performed. Specifically, SiC substrate 10 shown in FIG. 1 is prepared as a substrate for use in forming the silicon carbide semiconductor device. As SiC substrate 10, a SiC wafer of n type or a SiC wafer of p type may be employed, for example.

Next, a step (S20) of forming a SiC layer is performed. Specifically, a SiC layer 11 made of silicon carbide is formed on one main surface of SiC substrate 10, as with SiC layer 11 of stacked structure 10A in FIG. 1.

Step (S20) of forming the SiC layer is performed by means of, for example, epitaxial growth for the following purposes: to secure good electric characteristics of the semiconductor device to be formed, by allowing the main surface thereof for forming stacked structure 10A to correspond to the same crystal plane; and to provide an extra thickness in addition to that of SiC substrate 10. Depending on the substrate used and the purpose of use of the semiconductor device to be formed, an n type epitaxial layer or a p type epitaxial layer may be formed.

In order to form the epitaxial layer, it is preferable to employ a vapor phase epitaxy method for implementing vapor phase growth, for example, by mixing a material gas with an impurity source. The material gas contains Si and C to constitute SiC, and examples thereof include silane ($SiH_4$) and propane ($C_3H_8$). The impurity source is to provide an n type or p type semiconductor characteristic thereto and examples thereof include aluminum (Al) and phosphorus (P). In addition, examples of the p type impurity source for forming the p type epitaxial layer include diborane ($B_2H_6$) and trimethylaluminum (TMA), whereas an example of the n type impurity source for forming the n type epitaxial layer includes nitrogen ($N_2$) gas.

Next, a step (S30) of forming a first metal layer is performed. Specifically, this step is a step of forming first metal layer 12 on the one main surface of SiC layer 11 shown in FIG. 1. First metal layer 12 is made of one first metallic element and does not include carbon atoms. First metal layer 12 will be used to form the ohmic electrode in the subsequent thermal treatment.

Here, if carbon atoms are included in first metal layer 12, in the subsequent step of performing the thermal treatment, the carbon atoms can be deposited on the surface layer of stacked structure 10A shown in FIG. 1. Hence, it is preferable that first metal layer 12 does not include carbon atoms. Here, the expression "not include carbon atoms" indicates that, for example, an amount of carbon atoms is 1% or smaller in atomicity. It should be noted that first metal layer 12 is preferably formed using sputtering, vacuum deposition, ion beam deposition, or a plating method. As described above, the metallic element constituting first metal layer 12 is preferably one element selected from a group consisting of nickel, titanium, aluminum, platinum, tungsten, and palladium.

Next, a step (S40) of forming a Si layer is performed. Specifically, this step is a step of forming Si layer 13 on the opposite surface of first metal layer 12 to its surface facing SiC layer 11 as shown in FIG. 1. Si layer 13 is made of Si, and does not include carbon atoms. Si layer 13 will be used to form the ohmic electrode in the subsequent thermal treatment. Si layer 13 is preferably formed using a method such as the sputtering method.

Then, step (S50) of performing the thermal treatment is performed. Specifically, this step is a step of alloying first metal layer 12 and Si layer 13 constituting stacked structure 10A, by providing thermal treatment to the entire stacked structure 10A including first metal layer 12 and Si layer 13 each shown in FIG. 1 and used to form the ohmic electrode as described above.

For example, a preferable exemplary atmosphere for the thermal treatment onto stacked structure 10A shown in FIG. 1 in forming the ohmic electrode is an atmosphere of argon (Ar). Alternatively, an atmosphere of an inert gas such as nitrogen ($N_2$) may be used, for example. Further, the thermal treatment is performed at a temperature of not less than 800° C. and not more than 1100° C., more preferably, not less than 900° C. and not less than 1050° C. for not less than 30 seconds and not more than 5 minutes. By thus performing the thermal treatment, Si of Si layer 13 and the first metallic element constituting first metal layer 12 are silicided (alloyed). The portion thus alloyed forms an ohmic contact with SiC layer 11, thereby forming the ohmic electrode.

Figure 3:
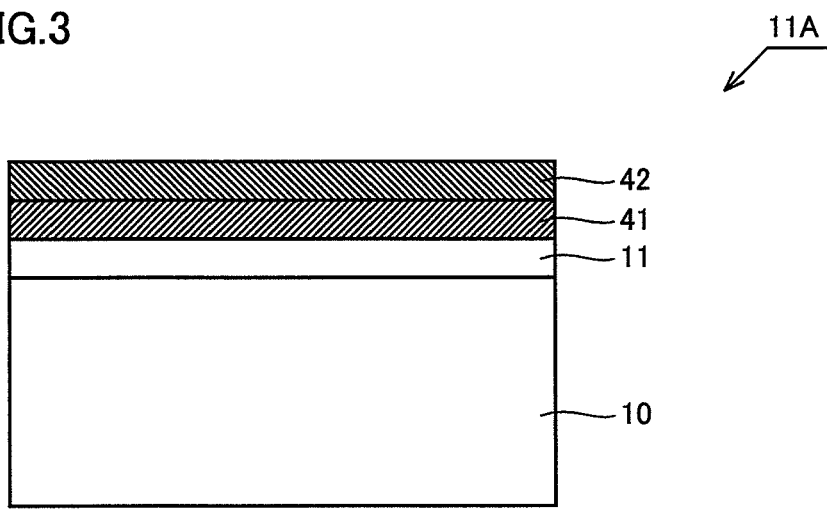
FIG. 3 is a schematic cross sectional view showing the stacked structure serving as the ohmic electrode after being subjected to the thermal treatment, in the first embodiment of the present invention.
Figure 4:
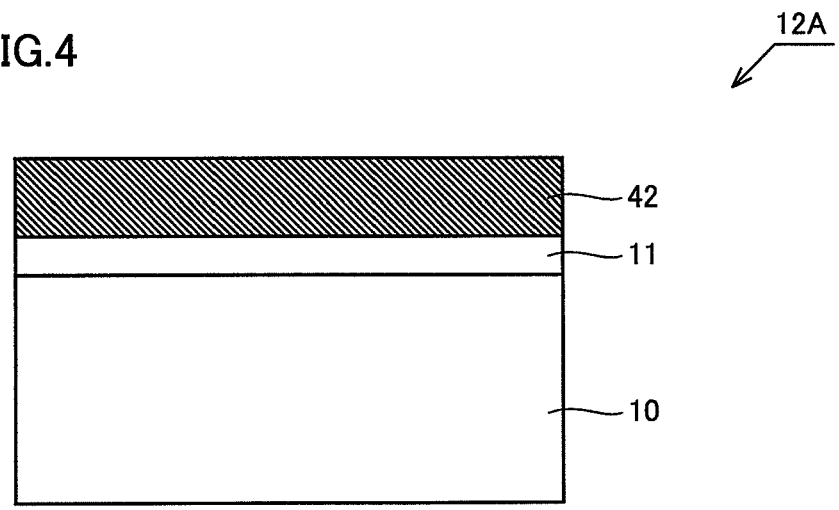
FIG. 4 is a schematic cross sectional view showing a stacked structure of an ohmic electrode after being subjected to thermal treatment, in a different form, which also serves as the first embodiment of the present invention.

FIG. 3 is a schematic cross sectional view showing the stacked structure serving as the ohmic electrode after being subjected to the thermal treatment, in the first embodiment of the present invention. FIG. 4 is a schematic cross sectional view showing a stacked structure of an ohmic electrode after being subjected to the thermal treatment, in a different form, which also serves as the first embodiment of the present invention.

Ohmic electrode 11A shown in FIG. 3 and ohmic electrode 12A shown in FIG. 4 have been both through step (S50) of performing the thermal treatment onto stacked structure 10A shown in FIG. 1. For example, ohmic electrode 11A shown in FIG. 3 includes: a carbon-containing silicide layer 41 which is disposed on the one main surface of SiC layer 11 made of silicon carbide, is made of an alloy of the one first metallic element and Si, and includes carbon atoms; and a silicide layer 42 which is disposed on an opposite main surface of carbon-containing silicide layer 41 to its surface facing SiC layer 11, is made of an alloy of the one first metallic element and Si, and does not include carbon atoms at a surface layer opposite to its surface facing carbon-containing silicide layer 41. SiC layer 11 and carbon-containing silicide layer 41 are in ohmic contact with each other. It should be noted that the term "surface layer" herein refers to a region distant away by 10 nm or shorter from the opposite surface (upper side in FIG. 3) of the uppermost layer, i.e., silicide layer 42 to carbon-containing silicide layer 41 in ohmic electrode 11A shown in FIG. 3, for example.

On the other hand, for example, ohmic electrode 12A shown in FIG. 4 includes a silicide layer 42, which is disposed on the one main surface of SiC layer 11 made of silicon carbide and formed on the one main surface of SiC substrate 10, which is made of an alloy of the one first metallic element and Si, and which does not include carbon atoms at a surface layer opposite to its surface facing SiC layer 11. SiC layer 11 and silicide layer 42 are in ohmic contact with each other.

When providing the thermal treatment to stacked structure 10A shown in FIG. 1, the one first metallic element constituting first metal layer 12 is first silicided with Si of Si layer 13. This is because the first metallic element reacts for silicidation with Si at a temperature lower than that with SiC. Here, because both first metal layer 12 and Si layer 13 are adapted not to include carbon atoms, silicide layer 42, which is the alloy formed as a result of the reaction therebetween, does not include carbon atoms. However, as the heating temperature is increased in the thermal treatment, the heating temperature reaches a temperature at which the first metallic element is silicided also with Si of SiC. Accordingly, first metal layer 12 is silicided with both Si of Si layer 13 and Si of SiC layer 11. As such, silicide layer 42 containing no carbon atoms as described above is formed due to the silicidation with Si of Si layer 13, whereas carbon-containing silicide layer 41 is formed which contains carbon atoms that become a residue in course of the silicidation with Si of SiC layer 11. This silicidation continues until all the first metallic element is silicided. When all the first metallic element is silicided to complete the reaction, as in ohmic electrode 11A shown in FIG. 3, carbon-containing silicide layer 41 resulting from the silicidation of Si of SiC layer 11 and the first metallic element is formed on the one main surface of SiC layer 11, and silicide layer 42 resulting from the silicidation of Si of Si layer 13 and the first metallic element is formed on the opposite surface (upper side in FIG. 3) of carbon-containing silicide layer 41 to its surface facing SiC layer 11.

However, for example, when all the first metallic element is silicided with Si of Si layer 13 before the heating temperature in the thermal treatment reaches the temperature at which the first metallic element is silicided with Si of SiC, as in ohmic electrode 12A shown in FIG. 4, silicide layer 42 having no carbon atoms is formed on the opposite surface (upper side in FIG. 4) of SiC layer 11 to its surface facing SiC substrate 10, as a result of the silicidation of Si of Si layer 13 with the first metallic element.

When either one of the ohmic electrodes configured as in FIG. 3 and FIG. 4 is formed, with silicide layer 42 thus existing, carbon atoms of carbon-containing silicide layer 41 and SiC layer 11 do not reach each surface layer of ohmic electrodes 11A, 12A, i.e., the surface layer of silicide layer 42. Accordingly, using the method for manufacturing the ohmic electrode in accordance with the present invention, carbon atoms are not deposited on the surface layer of each of ohmic electrodes 11A, 12A, i.e., the surface layer of silicide layer 42. This allows for good adhesion of a wire to the surface layer of silicide layer 42.

Figure 35:
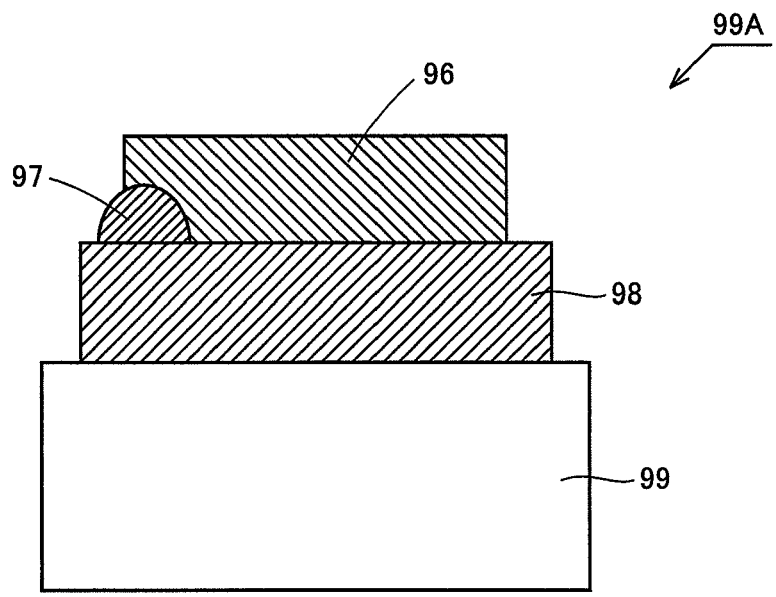
FIG. 35 is a schematic cross sectional view showing a state between an electrode and a wire in a general SiC semiconductor device.
Figure 36:
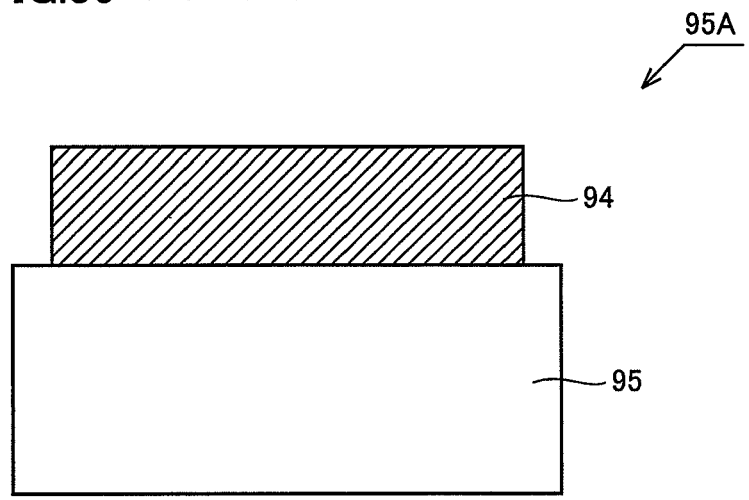
FIG. 36 is a schematic cross sectional view showing the structure in which the alloy layer of Ni and Si is formed on a SiC semiconductor layer.

With the ohmic electrode being thus formed, a step (S60) of forming a wire portion is performed finally. Specifically, this is a step of forming a metal layer (pad) on the surface layer of the ohmic electrode, i.e., the surface layer of silicide layer 42 of each of ohmic electrodes 11A, 12A in FIG. 3 and FIG. 4. The metal layer is to be used as a wire for extraction of an electric signal although not shown in FIG. 3 and FIG. 4. The wire portion can be formed using vacuum deposition, ion beam deposition, sputtering, or the like, for example. As described above, carbon atoms or deposited carbon 97 (see FIG. 35) do not exist on the surface layer of silicide layer 42 of each of ohmic electrodes 11A, 12A shown in FIG. 3 and FIG. 4. This allows for good adhesion of the wire portion to the surface layer of silicide layer 42.

(Second Embodiment)

Figure 5:
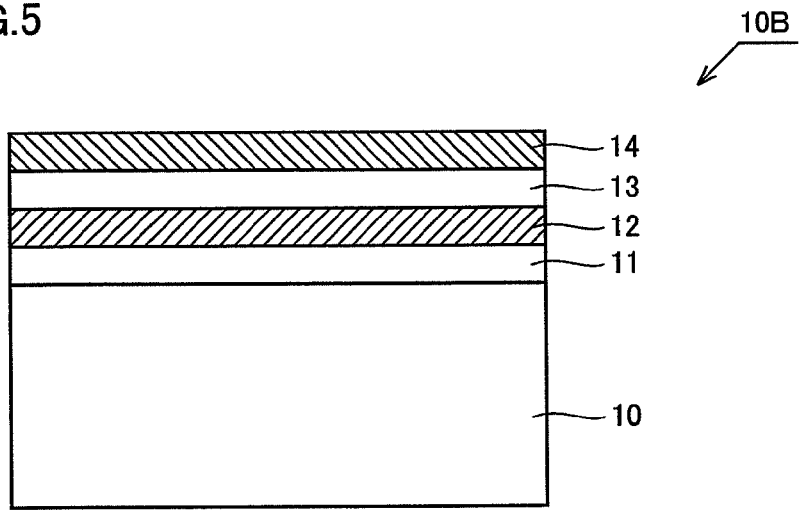
FIG. 5 is a schematic cross sectional view showing a stacked structure for forming an ohmic electrode of a silicon carbide semiconductor device according to a second embodiment of the present invention.
Figure 6:
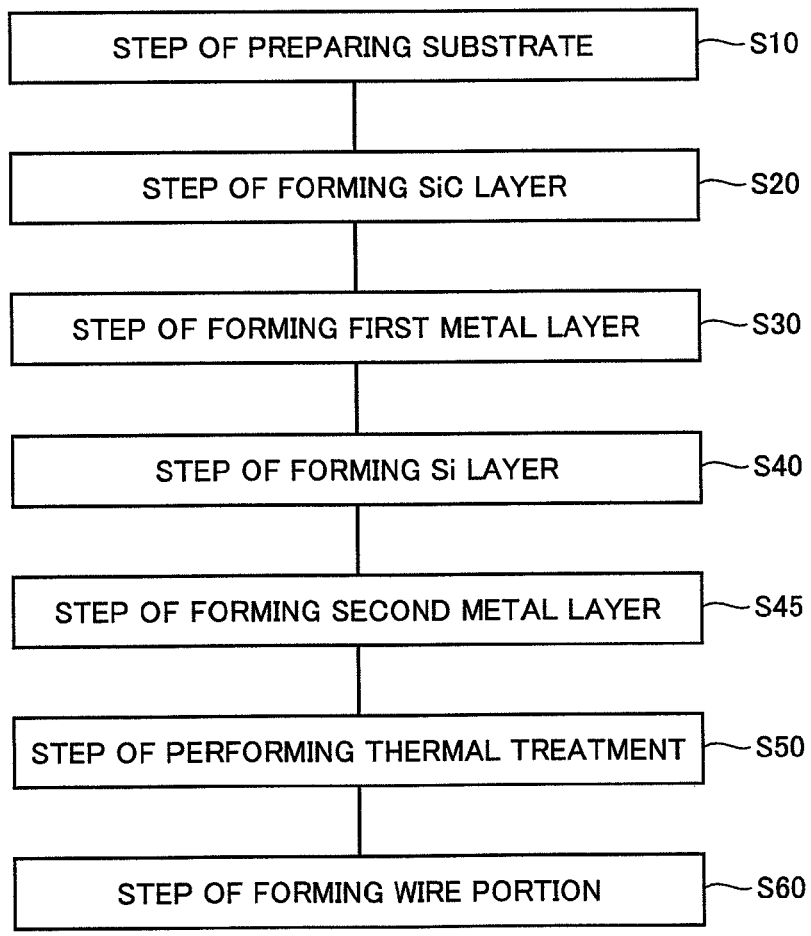
FIG. 6 is a flowchart showing a procedure for forming the silicon carbide semiconductor device according to the second embodiment of the present invention.

FIG. 5 is a schematic cross sectional view showing a stacked structure for forming an ohmic electrode of a silicon carbide semiconductor device according to a second embodiment of the present invention. FIG. 6 is a flowchart showing a procedure for forming the silicon carbide semiconductor device according to the second embodiment of the present invention. Here, a stacked structure 10B shown in FIG. 5 represents a stacked structure used to form the silicon carbide semiconductor device according to the second embodiment of the present invention and having not been subjected to thermal treatment yet.

As shown in stacked structure 10B of FIG. 5, the stacked structure prepared to form the ohmic electrode of the silicon carbide semiconductor device according to the second embodiment of the present invention has a configuration similar to that of stacked structure 10A of the first embodiment of the present invention (see FIG. 1). However, in stacked structure 10B, a second metal layer 14 is formed on an opposite surface (upper side in FIG. 5) of Si layer 13 to its surface facing first metal layer 12. Second metal layer 14 is made of one second metallic element, and does not include carbon atoms. Only in this point, stacked structure 10B is different from stacked structure 10A.

After the thermal treatment step, the wire portion is supposed to be formed on the surface layer of the ohmic electrode. For example, in each of ohmic electrodes 11A, 12A in the first embodiment of the present invention, the wire portion is formed on the surface layer of silicide layer 42. However, in the second embodiment of the present invention, second metal layer 14 is formed as the uppermost layer of stacked structure 10B. Accordingly, depending on conditions after performing the thermal treatment, the surface layer of the ohmic electrode formed can correspond to second metal layer 14. Accordingly, by forming the wire portion on second metal layer 14, adhesion between the metallic element constituting the wire portion and the surface layer of the ohmic electrode becomes better than that in the case of forming the wire portion on the silicide layer, thereby improving adhesion between the wire portion and the ohmic electrode.

Next, the following describes a method for manufacturing the silicon carbide semiconductor device according to the second embodiment of the present invention. As shown in a flowchart of FIG. 6, the method for manufacturing the silicon carbide semiconductor device according to the second embodiment of the present invention is basically the same as the method for manufacturing the silicon carbide semiconductor device according to the first embodiment of the present invention. However, as shown in FIG. 6, the method for manufacturing the silicon carbide semiconductor device according to the second embodiment of the present invention further includes a step (S45) of forming the second metal layer on the opposite surface of Si layer 13 to its surface facing first metal layer 12, the second metal layer being made of the one second metallic element and containing no carbon atoms. Step (S45) is performed after forming Si layer 13 of FIG. 5 in step (S40) of forming the Si layer and before step (S50) of performing the thermal treatment.

Here, if carbon atoms are included in second metal layer 14, in the subsequent step of performing the thermal treatment, the carbon atoms will be diffused, whereby the surface layer of stacked structure 10B shown in FIG. 5 includes carbon atoms. Hence, it is preferable that second metal layer 14 does not include carbon atoms. Here, the expression "not include carbon atoms" indicates that, for example, an amount of carbon atoms is 1% or smaller in atomicity. It should be noted that as with first metal layer 12, second metal layer 14 is also preferably formed using sputtering, vacuum deposition, ion beam deposition, or a plating method. As described above, the element constituting the first metal layer is preferably one element selected from a group consisting of nickel, titanium, aluminum, platinum, tungsten, and palladium. As with first metal layer 12, second metal layer 14 is preferably made of one metallic element. The second metallic element constituting second metal layer 14 is preferably one element selected from a group consisting of titanium, aluminum, and chromium. With this, in accordance with a correlation in work function of SiC and Si, a good ohmic electrode can be formed upon providing the thermal treatment to stacked structure 10B.

The flowchart of FIG. 6 is different from the flowchart of FIG. 2 in the above-described point. Namely, step (S10) in FIG. 6 is the same step as step (S10) of FIG. 2. Likewise, steps (S20), (S30), (S40), (S50), and (S60) of FIG. 6 are the same as those in FIG. 2, respectively.

Figure 7:
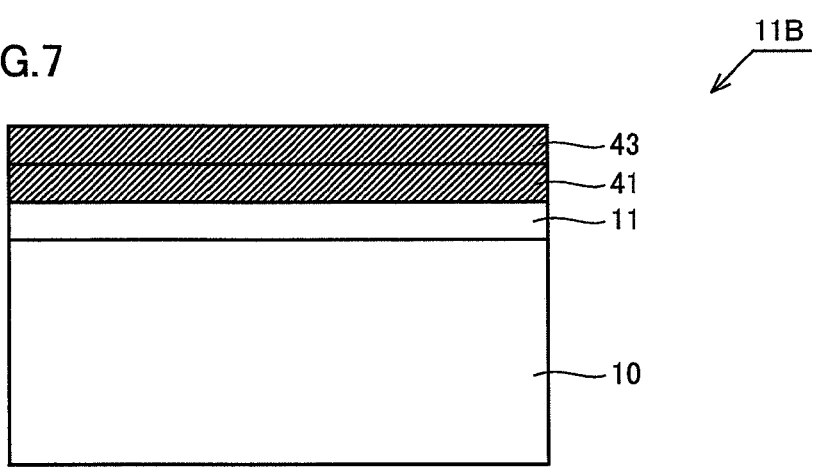
FIG. 7 is a schematic cross sectional view showing the stacked structure serving as the ohmic electrode after being subjected to the thermal treatment, in the second embodiment of the present invention.
Figure 8:
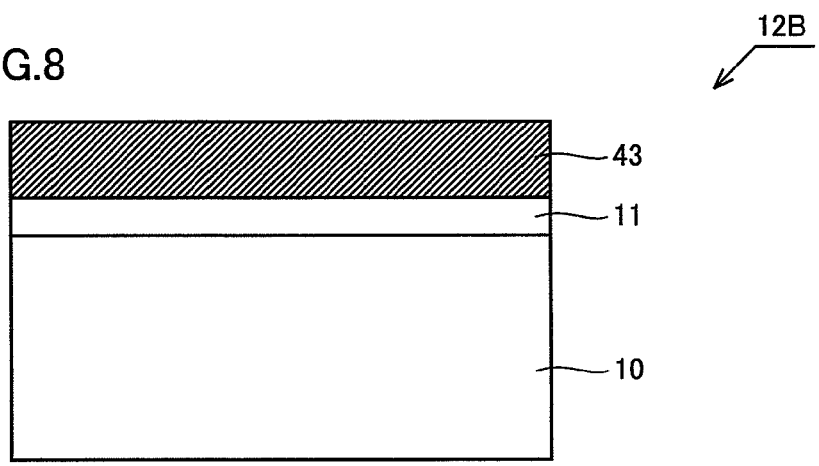
FIG. 8 is a schematic cross sectional view showing a stacked structure of an ohmic electrode after being subjected to thermal treatment, in a different form, which also serves as the second embodiment of the present invention.
Figure 9:
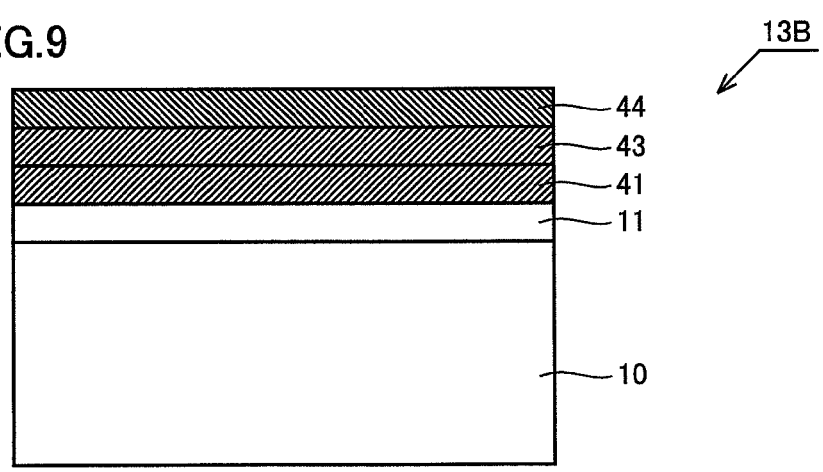
FIG. 9 is a schematic cross sectional view showing a stacked structure of an ohmic electrode after being subjected to thermal treatment, in still another form, which also serves as the second embodiment of the present invention.

However, the form of stacked structure 10B after step (S50) of performing the thermal treatment is different from that in the first embodiment of the present invention. FIG. 7 is a schematic cross sectional view showing the stacked structure serving as an ohmic electrode after being subjected to the thermal treatment, in the second embodiment of the present invention. FIG. 8 is a schematic cross sectional view showing a stacked structure of an ohmic electrode after being subjected to thermal treatment, in a different form, which also serves as the second embodiment of the present invention. FIG. 9 is a schematic cross sectional view showing a stacked structure of an ohmic electrode after being subjected to thermal treatment, in still another form, which also serves as the second embodiment of the present invention.

Ohmic electrode 11B shown in FIG. 7, ohmic electrode 12B shown in FIG. 8, and ohmic electrode 13B shown in FIG. 9 have been through step (S50) of performing the thermal treatment to stacked structure 10B shown in FIG. 5. For example, when Si of Si layer 13 shown in FIG. 5 is first silicided with the first metallic element of first metal layer 12 and the second metallic element of second metal layer 14, there is formed a silicide layer 43 in which the three elements, i.e., Si, the first metallic element, and the second metallic element are mixed. However, for example, when the first metallic element starts to be silicided with Si of SiC layer 11 before all the first metallic element reacts with Si layer 13 for silicidation, as shown in FIG. 7, there is formed an ohmic electrode 11B provided with a carbon-containing silicide layer 41 and a silicide layer 43. Silicide layer 41 is formed on the opposite surface of SiC layer 11 to its surface facing SiC substrate 10 (upper side in FIG. 7), is made of an alloy of the first metallic element and Si, and contains carbon atoms. Silicide layer 43 is disposed on the opposite main surface of carbon-containing silicide layer 41 to its surface facing SiC layer 11, is made of an alloy of the first metallic element, the second metallic element, and Si, and contains no carbon atoms at its surface layer opposite to the surface facing carbon-containing silicide layer 41.

However, for example, when all the first metallic element is silicided with Si of Si layer 13 before the heating temperature in the thermal treatment reaches the temperature at which the first metallic element is silicided with Si of SiC, as in ohmic electrode 12B shown in FIG. 8, silicide layer 43 having no carbon atoms is formed on the opposite surface (upper side in FIG. 8) of SiC layer 11 to its surface facing SiC substrate 10, as a result of the silicidation of Si of Si layer 13, the first metallic element, and the second metallic element.

Further, when the thickness of Si layer 13 is larger by a certain value depending on the type of the metal, for example, is twice or more than twice larger than the total thickness of first metal layer 12 and second metal layer 14 shown in FIG. 5, Si of Si layer 13 may individually react with the first metallic element and the second metallic element. It should be noted that the term "thickness" herein refers to a distance between main surfaces opposite to each other. For example, the three elements, i.e., Si of Si layer 13, the first metallic element, the second metallic element may be mixed and silicided at the lower side of stacked structure 10B (lower side in FIG. 5), whereas only second metallic element may be silicided with Si of Si layer 13 at the upper side of stacked structure 10B (upper side in FIG. 5) because Si layer 13 is so thick that the first metallic element does not reach there. This may result in formation of ohmic electrode 13B further including an upper silicide layer 44 that is made of an alloy of one second metallic element and Si and that has no carbon atoms at its surface layer opposite to the surface facing silicide layer 43, as shown in FIG. 9. Further, although not shown in the figure, for example, an ohmic electrode may be formed in which a silicide layer made of the alloy of the one first metallic element and Si and the silicide layer made of the alloy of the one second metallic element and Si are stacked on each other.

In the ohmic electrode thus configured, two elements, i.e., the one metallic element and Si are silicided, whereby the reaction can be readily estimated using a phase diagram as compared with the case of forming silicide layer 43 by mixing the three elements. Further, in the second embodiment of the present invention, second metal layer 14 is provided in stacked structure 10B, so a distance (thickness) from SiC layer 11 to the surface layer of the uppermost layer of the stacked structure is longer than that in the first embodiment of the present invention. Accordingly, C of SiC layer 11 can be less likely to reach the surface layer.

Further, for example, when the temperature at which the second metallic element reacts with Si is much higher than the temperature at which the first metallic element reacts with Si, or when the thickness of second metal layer 14 is remarkably thick, not all the second metallic element may react with Si to be silicided. In this case, although not shown in the figures, for example, second metal layer 14 remains on the surface layer of ohmic electrode shown in each of FIG. 7 to FIG. 9 (uppermost layer of silicide layer 43 in each of FIG. 7 and FIG. 8; the uppermost layer of upper silicide layer 44 in FIG. 9). In this case, in the ohmic electrode, the wire portion is to be formed in contact with the surface layer of second metal layer 14. Accordingly, better adhesion can be attained as compared with the case of forming the wire portion on the surface layer of the silicide layer.

The second embodiment of the present invention is different from the first embodiment of the present invention only in the above-described point. Thus, configurations, conditions, procedures, effects, and the like not mentioned above in the second embodiment of the present invention are all the same as those in the first embodiment of the present invention.

(Third Embodiment)

Figure 10:
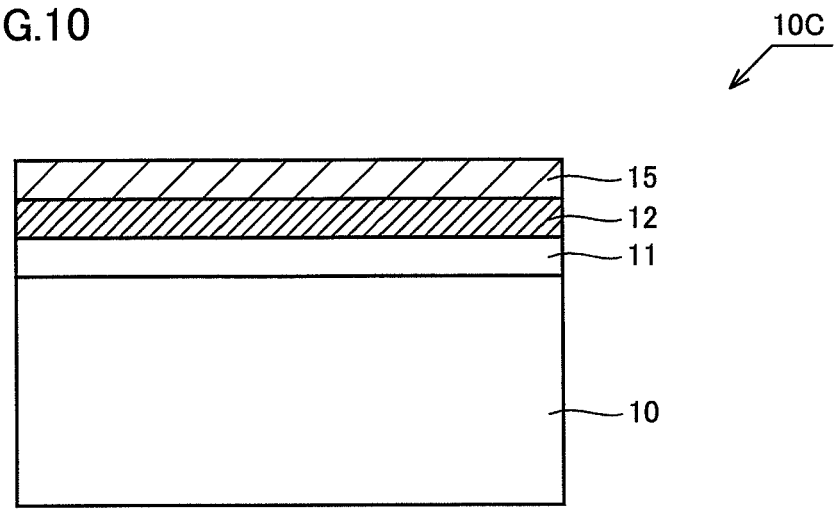
FIG. 10 is a schematic cross sectional view showing a stacked structure for forming an ohmic electrode of a silicon carbide semiconductor device according to a third embodiment of the present invention.

FIG. 10 is a schematic cross sectional view showing a stacked structure for forming an ohmic electrode of a silicon carbide semiconductor device according to a third embodiment of the present invention. Here, stacked structure 10C shown in FIG. 10 represents a stacked structure used to form the silicon carbide semiconductor device according to the third embodiment of the present invention and having not been subjected to the thermal treatment yet.

As shown in stacked structure 10C of FIG. 10, the stacked structure prepared to form the ohmic electrode of the silicon carbide semiconductor device according to the third embodiment of the present invention has a configuration similar to that of stacked structure 10A of the first embodiment of the present invention (see FIG. 1). However, in stacked structure 10C, a Si metal layer 15 is formed instead of Si layer 13 in stacked structure 10A. Si metal layer 15 is made of Si and one first metallic element, and does not include carbon atoms. Only in this point, stacked structure 10C is different from stacked structure 10A.

The procedure of forming the silicon carbide semiconductor device according to the third embodiment of the present invention is similar to the procedure of forming the silicon carbide semiconductor device according to the first embodiment of the present invention as shown in FIG. 2. However, as described above, in stacked structure 10C, instead of Si layer 13 in stacked structure 10A, Si metal layer 15 is formed. Hence, step (S40) of forming the Si layer in FIG. 2 is changed to a step (S40) of forming the Si metal layer.

As such, with Si metal layer 15, i.e., the Si-containing layer adapted to contain the first metallic element at the initial state before performing the thermal treatment, the Si element is located close to the first metallic element, thereby achieving faster silicidation of Si and the first metallic element upon performing the thermal treatment. This can prevent the silicidation of the first metallic element and Si of SiC layer 11, thereby restraining the phenomenon of depositing C of SiC layer 11. It should be noted that as the first metallic element constituting Si metal layer 15, one element selected from a group consisting of nickel, titanium, aluminum, platinum, tungsten, and palladium may be used or one element selected from a group consisting of titanium, aluminum, and chromium may be used as with the second metallic element described in the second embodiment.

The third embodiment of the present invention is different from the first embodiment of the present invention only in the above-described point. Thus, configurations, conditions, procedures, effects, and the like not mentioned above in the third embodiment of the present invention are all the same as those in the first embodiment of the present invention.

(Fourth Embodiment)

Figure 11:
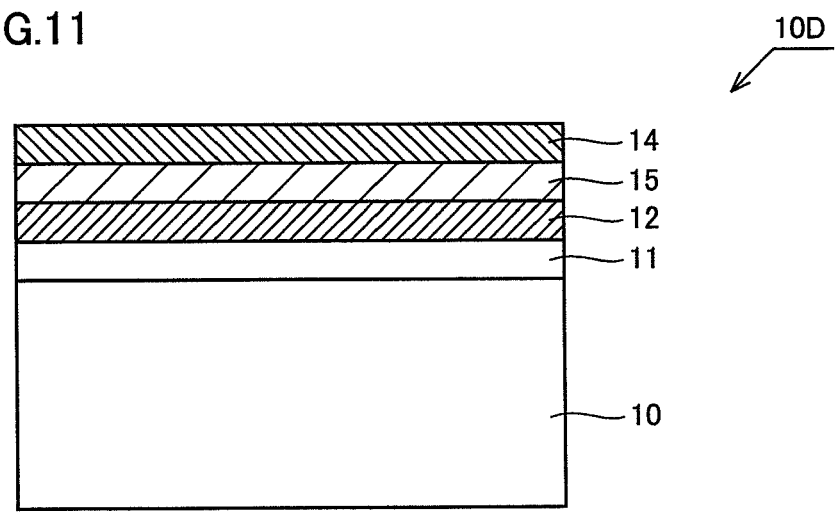
FIG. 11 is a schematic cross sectional view showing a stacked structure for forming an ohmic electrode of a silicon carbide semiconductor device according to a fourth embodiment of the present invention.

FIG. 11 is a schematic cross sectional view showing a stacked structure for forming an ohmic electrode of a silicon carbide semiconductor device according to a fourth embodiment of the present invention. Here, stacked structure 10D shown in FIG. 11 represents a stacked structure used to form the silicon carbide semiconductor device according to the fourth embodiment of the present invention and having not been subjected to the thermal treatment yet.

As shown in stacked structure 10D of FIG. 11, the stacked structure prepared to form the ohmic electrode of the silicon carbide semiconductor device according to the fourth embodiment of the present invention has a configuration similar to that of stacked structure 10B of the second embodiment of the present invention (see FIG. 1). However, in stacked structure 10D, instead of Si layer 13 in stacked structure 10B, as with stacked structure 10C in the third embodiment of the present invention, there is formed a Si metal layer 15 made of Si and one first metallic element and containing no carbon atoms. Namely, in stacked structure 10D, there is performed an additional step of forming a second metal layer 14, which is made of one second metallic element and does not include carbon atoms, on an opposite surface of Si metal layer 15 to its surface facing first metal layer 12. As such, second metal layer 14 may be formed on the main surface of Si metal layer 15. Only in this point, stacked structure 10D is different from stacked structure 10B.

The procedure of forming the silicon carbide semiconductor device according to the fourth embodiment of the present invention is similar to the procedure of forming the silicon carbide semiconductor device according to the second embodiment of the present invention as shown in FIG. 6. However, as described above, in stacked structure 10D, instead of Si layer 13 in stacked structure 10B, Si metal layer 15 is formed. Hence, step (S40) of forming the Si layer in FIG. 6 is changed to a step (S40) of forming the Si metal layer.

As such, also in the case where second metal layer 14 is formed on the main surface of Si metal layer 15, with Si metal layer 15, i.e., the Si-containing layer adapted to contain the first metallic element at the initial state before performing the thermal treatment, the Si element is located close to the first metallic element, thereby achieving faster silicidation of Si and the first metallic element upon performing the thermal treatment.

The fourth embodiment of the present invention is different from the second embodiment of the present invention only in the above-described point. Thus, configurations, conditions, procedures, effects, and the like not mentioned above in the fourth embodiment of the present invention are all the same as those in the second embodiment of the present invention.

EXAMPLE 1

Figure 12:
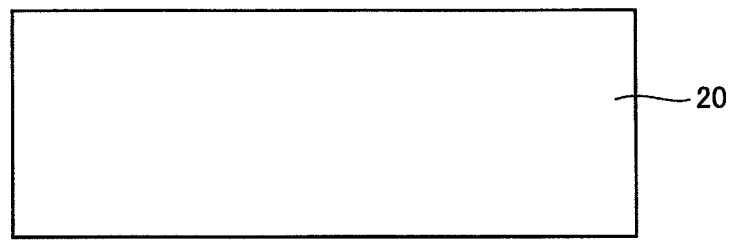
FIG. 12 is a schematic cross sectional view showing a state in which a step (S10) of FIG. 6 has been performed to form the pn diode.
Figure 13:
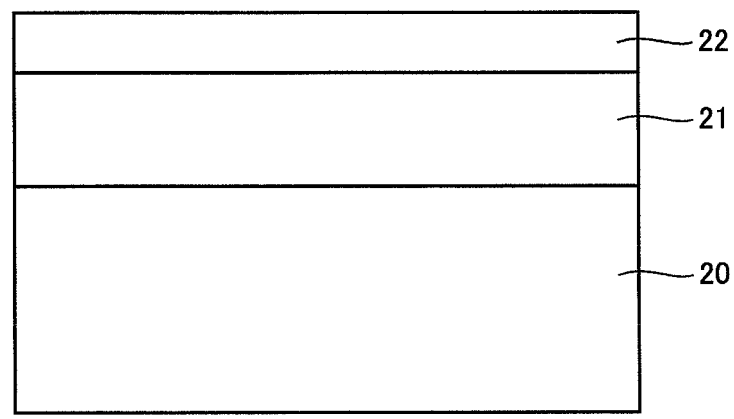
FIG. 13 is a schematic cross sectional view showing a state in which a step (S20) of FIG. 6 has been performed to form the pn diode.
Figure 14:
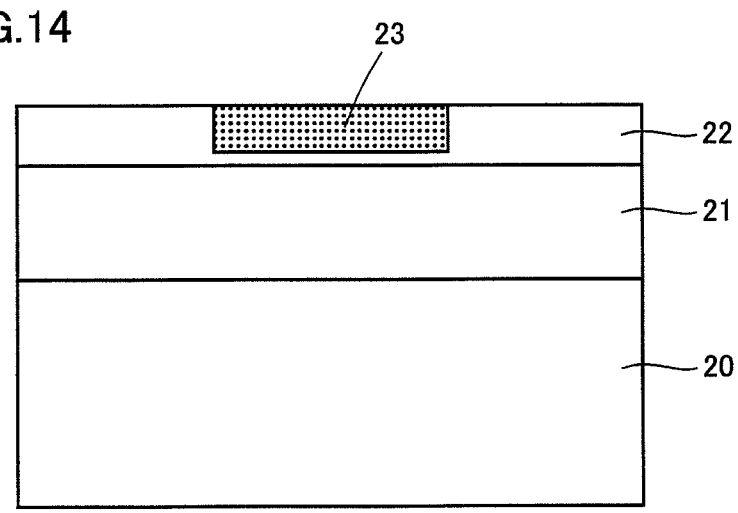
FIG. 14 is a schematic cross sectional view showing a state in which ion implantation has been performed to form the pn diode.
Figure 15:
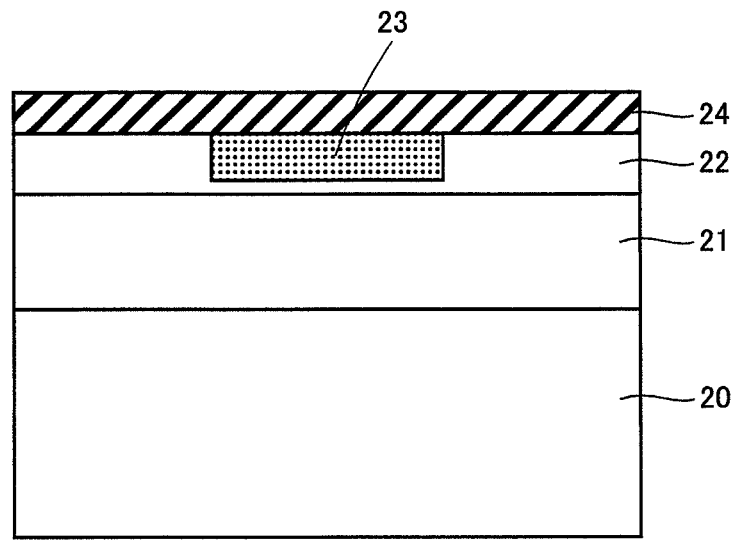
FIG. 15 is a schematic cross sectional view showing a state in which a field oxide film is formed to form the pn diode.
Figure 16:
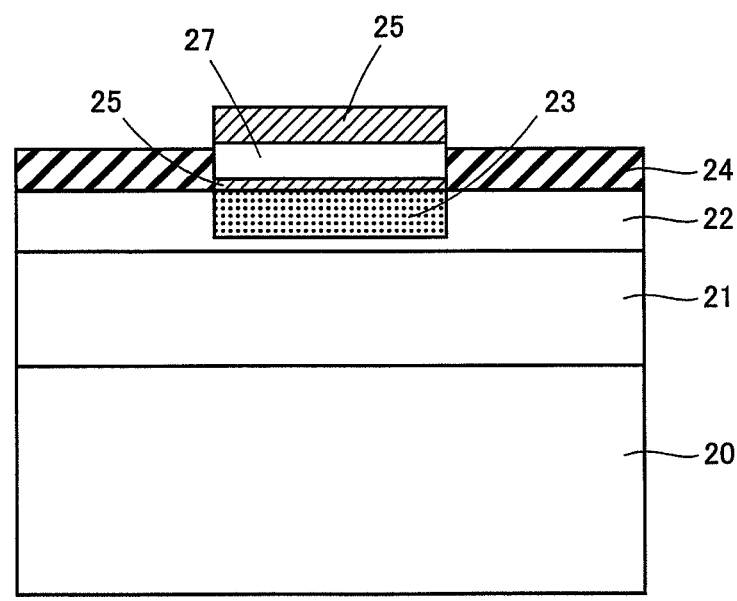
FIG. 16 is a schematic cross sectional view showing a state in which a step (S45) of FIG. 6 has been performed to form the pn diode.
Figure 17:
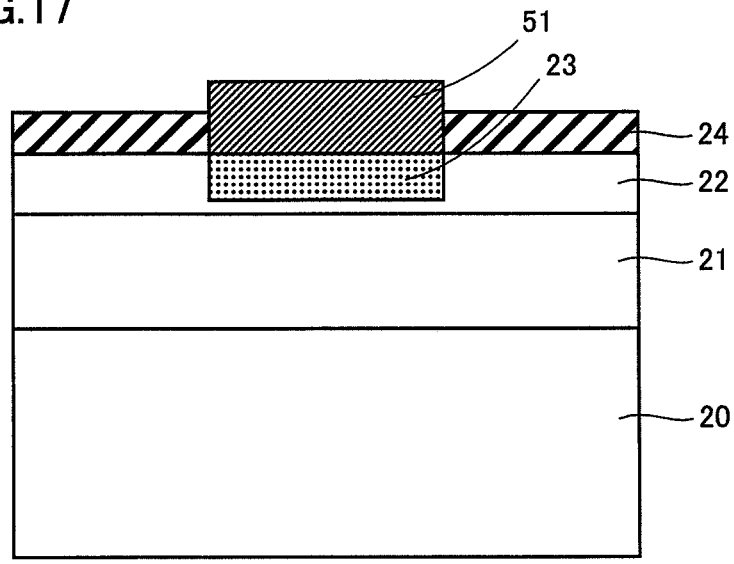
FIG. 17 is a schematic cross sectional view showing a state in which step (S50) of FIG. 6 has been performed to form the pn diode.
Figure 18:
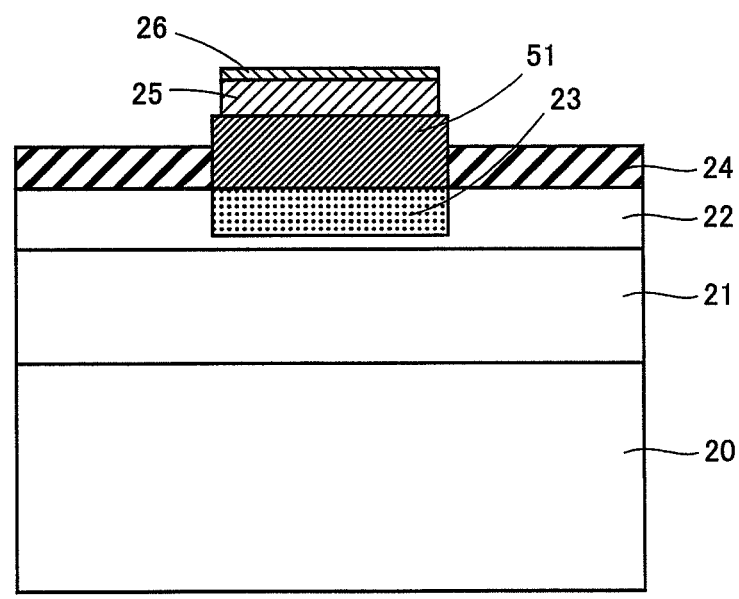
FIG. 18 is a schematic cross sectional view showing a state in which a step (S60) of FIG. 6 has been performed to form the pn diode.
Figure 19:
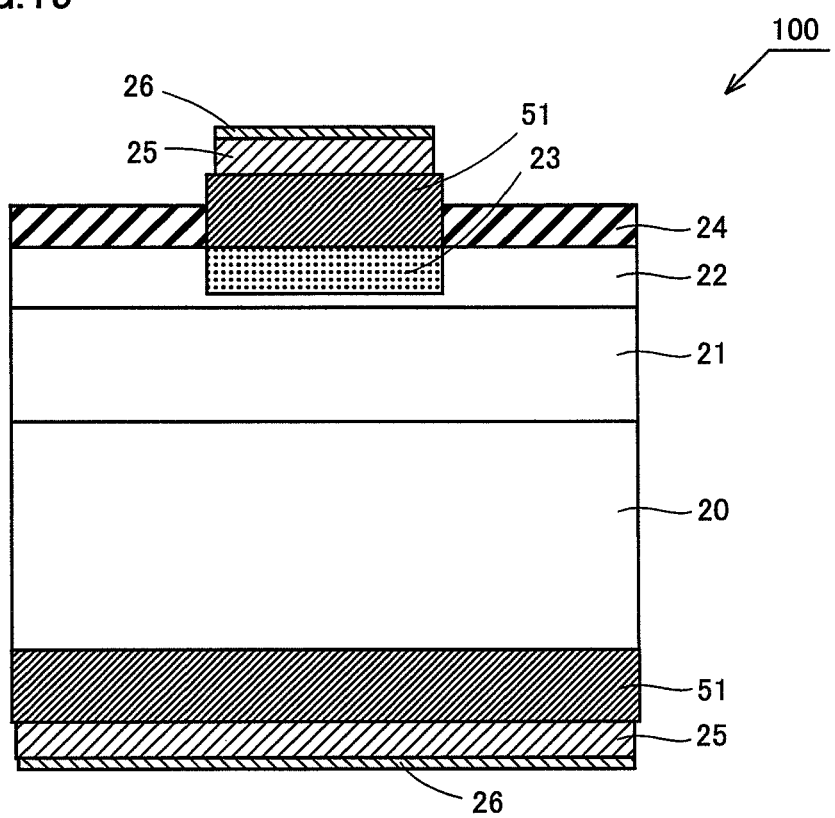
FIG. 19 is a schematic cross sectional view of the pn diode completed.

FIG. 12-FIG. 19 are schematic cross sectional views respectively showing states after performing the steps in the case of forming a pn diode using the second embodiment of the present invention. More specifically, FIG. 12 is a schematic cross sectional view showing a state in which step (S10) of FIG. 6 has been performed to form the pn diode. FIG. 13 is a schematic cross sectional view showing a state in which step (S20) of FIG. 6 has been performed to form the pn diode. FIG. 14 is a schematic cross sectional view showing a state in which ion implantation has been performed to form the pn diode. FIG. 15 is a schematic cross sectional view showing a state in which a field oxide film has been formed to form the pn diode. FIG. 16 is a schematic cross sectional view showing a state in which step (S45) of FIG. 6 has been performed to form the pn diode. FIG. 17 is a schematic cross sectional view showing a state in which step (S50) of FIG. 6 has been performed to form the pn diode. FIG. 18 is a schematic cross sectional view showing a state in which step (S60) of FIG. 6 has been performed to form the pn diode. FIG. 19 is a schematic cross sectional view of the pn diode completed. Referring to FIG. 12-FIG. 19, the following illustrates a method for manufacturing the pn diode to which the present invention is applied.

First, as shown in FIG. 12, a SiC substrate 20 of n type is prepared as step (S10) of preparing the substrate in FIG. 6, for example. Then, as step (S20) of forming the SiC layer of FIG. 6, an $n^-$ type epitaxial layer 21 (see FIG. 13) is formed on one main surface of SiC substrate 20. Further, a $p^+$ type epitaxial layer 22 (see FIG. 13) is formed on an opposite surface of $n^-$ type epitaxial layer 21 to its surface facing SiC substrate 20. In this way, a stacked structure of $n^-$ type epitaxial layer 21 and $p^+$ type epitaxial layer 22 is formed as shown in FIG. 13. $N^-$ type epitaxial layer 21 has an impurity concentration of $1e16\,cm^{-3}$ and has a film thickness of 10 μm, whereas $p^+$ type epitaxial layer 22 has an impurity concentration of 2e17 cm$^{-3}$ and has a film thickness of 0.8 μm.

Next, as shown in FIG. 14, Al ions are implanted into p$^+$ type epitaxial layer 22, thereby forming an Al ion implantation region 23. This step of forming Al ion implantation region 23 is a step of forming a region having an impurity concentration greater by approximately two to three digits than the impurity concentration of p$^+$ type epitaxial layer 22 so as to attain a good electric contact between an ohmic electrode to be formed and the substrate. A dose of the Al ions in this ion implantation is 1e15 cm$^{-2}$. Further, as shown in FIG. 14, a depth in which the Al ions are implanted is preferably shallower than the thickness of p$^+$ type epitaxial layer 22.

In order to form Al ion implantation region 23 shown in FIG. 14, a silicon oxide film (SiO$_2$ film) having a certain thickness is first formed by thermal oxidation on p$^+$ type epitaxial layer 22 at its main surface not facing n$^-$ type epitaxial layer 21. Then, a resist having a certain thickness is applied to the SiO$_2$ film. In this state, for example, the resist is patterned using a photolithography method. Then, the resist thus having the pattern formed thereon is used as a mask for etching, such as RIE etching, on the SiO$_2$ film, thereby partially removing (patterning) the SiO$_2$ film. As a result, the SiO$_2$ film is provided with an opening from which Al ion implantation region 23 is exposed. Then, the resist is removed, and Al ions are implanted into the opening of the SiO$_2$ film from the main surface side of p$^+$ type epitaxial layer 22 which does not face n$^-$ type epitaxial layer 21. Thereafter, the SiO$_2$ film is removed. In this way, Al ion implantation region 23 shown in FIG. 14 is formed. Al ion implantation region 23 has a higher impurity concentration and a smaller electric resistance than those of p$^+$ type epitaxial layer 22. This allows for a good electric contact between the ohmic electrode to be formed and the substrate.

Here, in order to activate the impurity of Al ion implantation region 23, activation annealing (thermal treatment) is performed at 1700° C. for 30 minutes. Thereafter, as shown in FIG. 15, a field oxide film 24 (having a thickness of 50 nm) made of SiO$_2$ is formed on the main surfaces of p$^+$ type epitaxial layer 22 and Al ion implantation region 23 (upper side in FIG. 15) by thermal oxidation in, for example, wet atmosphere. Field oxide film 24 is formed to protect the main surfaces of p$^+$ type epitaxial layer 22 and Al ion implantation region 23.

Next, for example, a mask having an opening pattern is formed on field oxide film 24 using the photolithography method. Etching or the like is performed using the mask to remove field oxide film 24 formed on Al ion implantation region 23 at its main surface not facing p$^+$ type epitaxial layer 22. This exposes the main surface of Al ion implantation region 23 which does not face p$^+$ type epitaxial layer 22. Then, in this state, as step (S30) of forming the first metal layer as shown in FIG. 6, a Ti thin film 25 having a thickness of, for example, 10 nm is formed on Al ion implantation region 23 as shown in FIG. 16. Instead of Ti (titanium), for example, Al (aluminum), Ni (nickel), Pt (platinum), W (tungsten), Pd (palladium) or the like may be used.

Next, as step (S40) of forming the Si layer as shown in FIG. 6, a Si layer 27 having a thickness of, for example, 50 nm is formed on a main surface of Ti thin film 25 as shown in FIG. 16. Next, as step (S45) of forming the second metal layer as shown in FIG. 6, a Ti thin film 25 having a thickness of 50 nm is formed on the main surface of Si layer 27 as shown in FIG. 16, for example. Instead of Ti (titanium), for example, Al (aluminum), Cr (chromium), or the like may be used.

In this state, as step (S50) of performing the thermal treatment as shown in FIG. 6, the entire structure shown in FIG. 16 is thermally treated at 1000° C. for 2 minutes. Accordingly, Ti of Ti thin film 25 serving as the first metal layer, Si of Si layer 27, and Ti of Ti thin film 25 serving as the second metal layer are silicided, thereby forming an electrode 51 serving as a silicide layer as shown in FIG. 17. Electrode 51 is an ohmic electrode, and may be configured in the form of a stack of the following individually formed regions: a region in which Ti thin film 25 serving as the first metal layer and Si of Si layer 27 are silicided; and a region in which Ti thin film 25 serving as the second metal layer and Si of Si layer 27 are silicided. Alternatively, electrode 51 may be configured to be one silicide layer obtained by mixing and siliciding the three elements, i.e., Ti thin film 25 serving as the first metal layer, Si of Si layer 27, and Ti thin film 25 serving as the second metal layer. Alternatively, Ti thin film 25 not silicided may remain in electrode 51 at its surface layer not facing Al ion implantation region 23.

In step (S60) of forming the wire portion, a Ti thin film 25 having a thickness of 50 nm and an Al thin film 26 having a thickness of 3 nm are formed as a wire (pad) on the surface layer of electrode 51 serving as the ohmic electrode as shown in FIG. 18, for example.

With the above-described procedure, one ohmic electrode of the pn diode is completed. However, in order to function it as an actual pn diode, two ohmic electrodes are required. Hence, as shown in FIG. 19, for example, another ohmic electrode (electrode 51) is formed on SiC substrate 20 at its main surface (backside surface) not facing n$^-$ type epitaxial layer 21, thereby completing pn diode 100 shown in FIG. 19. This pn diode 100 has the ohmic electrodes each having the wire adhered thereto well by preventing deposition of carbon atoms on the surface layer of electrode 51 and formation of a Schottky electrode by Si and SiC. It should be noted that methods for forming the ohmic electrode (electrode 51), Ti thin film 25, and Al thin film 26 on the backside surface of SiC substrate 20 are basically the same as the methods for forming electrode 51, Ti thin film 25, and Al thin film 26 on p$^+$ type epitaxial layer 22.

It should be noted that the ohmic electrode formed on SiC substrate 20 at its main surface not facing n$^-$ type epitaxial layer 21 may be formed in the same manner as in the second embodiment of the present invention as shown in FIG. 19, but may be formed using another means. In forming it, ion implantation for doping an impurity into SiC substrate 20 at a high concentration is not required to attain a good electric contact with the ohmic electrode as shown in FIG. 19. This is due to the following reason: because SiC substrate 20 generally includes an impurity at a high concentration, SiC substrate 20 has a smaller contact resistance than that of p$^+$ type epitaxial layer 22, and can provide a good electric contact without any modification.

Further, as the above-described method for forming each ohmic electrode in pn diode 100, the formation method in the second embodiment of the present invention has been exemplified. However, the method is not limited to this and the ohmic electrode may be formed using the formation method in another embodiment of the present invention, for example, the first, third, or fourth embodiment of the present invention. Using any one of the embodiments, electrode 51 shown in each of FIG. 17-FIG. 19 is formed from one or two silicide layers by siliciding Si and one or two metallic elements.

EXAMPLE 2

Figure 20:
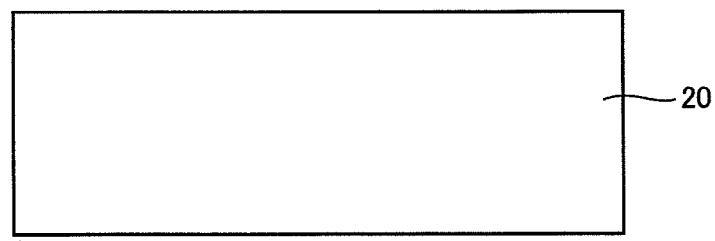
FIG. 20 is a schematic cross sectional view showing a state in which step (S10) of FIG. 6 has been performed to form the RESURF-JFET.
Figure 21:
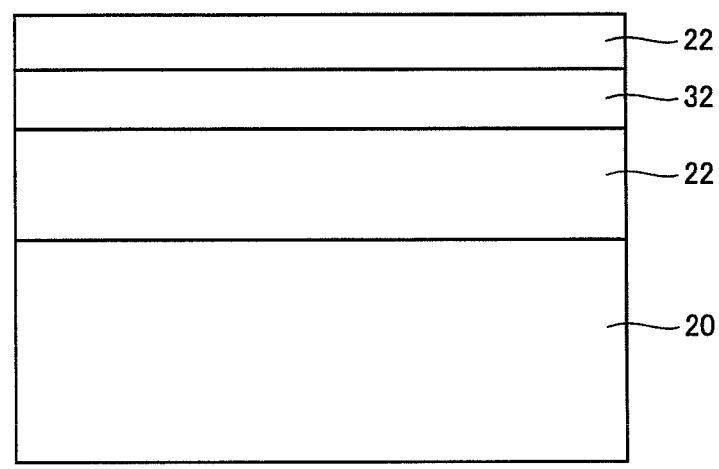
FIG. 21 is a schematic cross sectional view showing a state in which step (S20) of FIG. 6 has been performed to form the RESURF-JFET.
Figure 22:
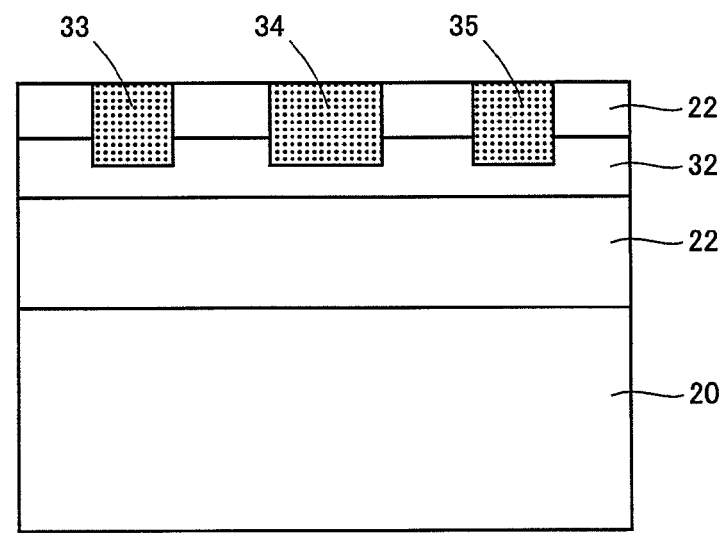
FIG. 22 is a schematic cross sectional view showing a state in which ion implantation has been performed to form the RESURF-JFET.
Figure 23:
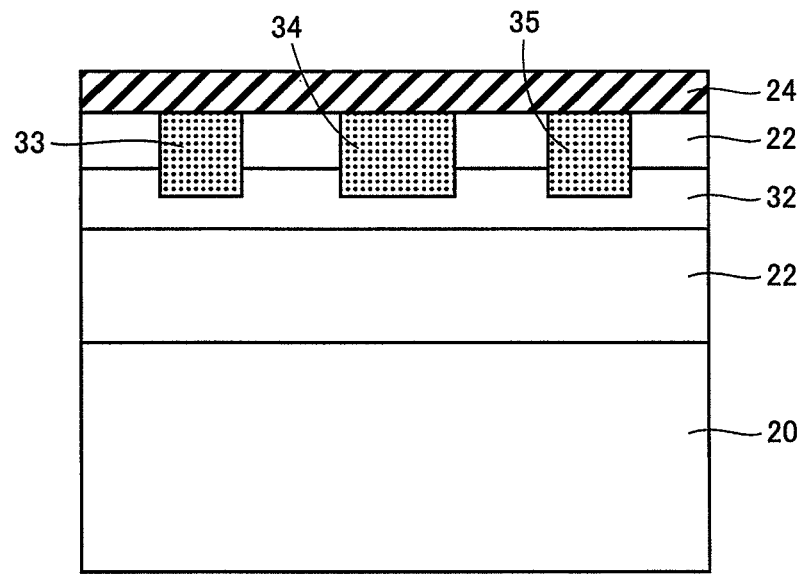
FIG. 23 is a schematic cross sectional view showing a state in which a field oxide film is formed to form the RESURF-JFET.
Figure 24:
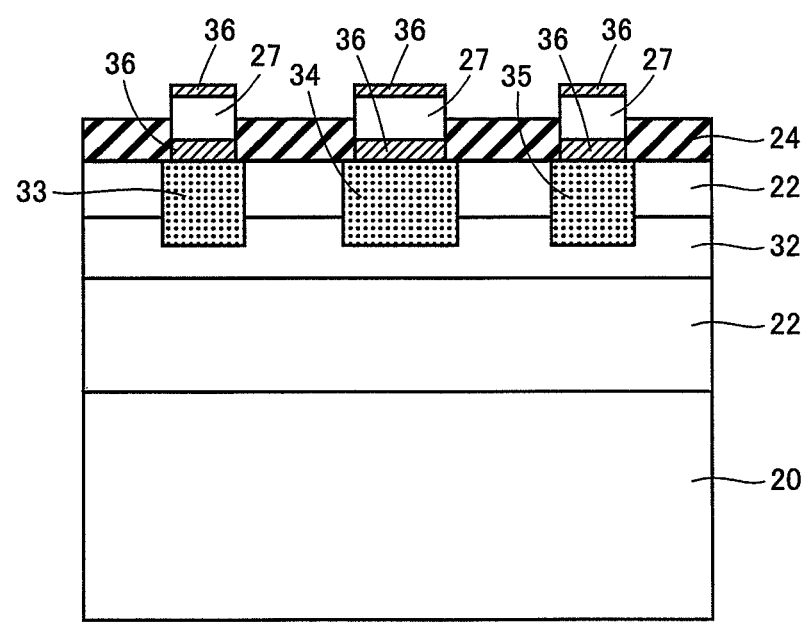
FIG. 24 is a schematic cross sectional view showing a state in which step (S45) of FIG. 6 has been performed to form the RESURF-JFET.
Figure 25:
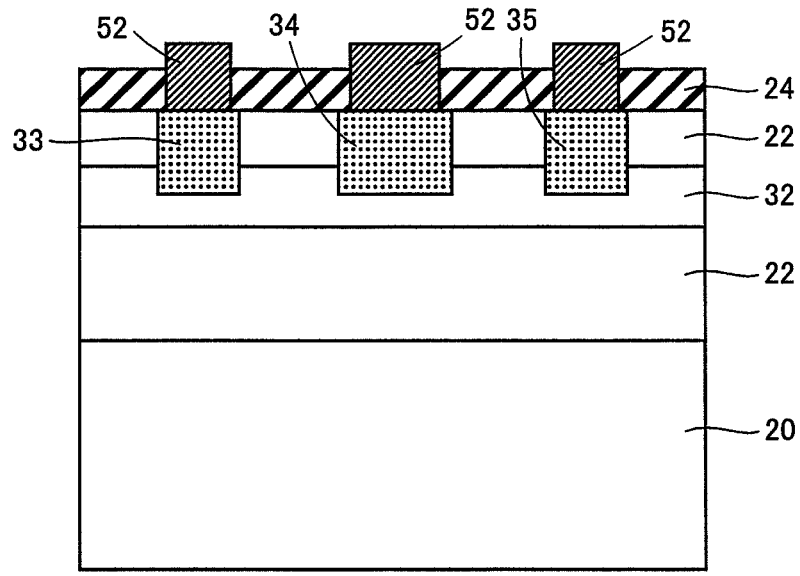
FIG. 25 is a schematic cross sectional view showing a state in which step (S50) of FIG. 6 has been performed to form the RESURF-JFET.
Figure 26:
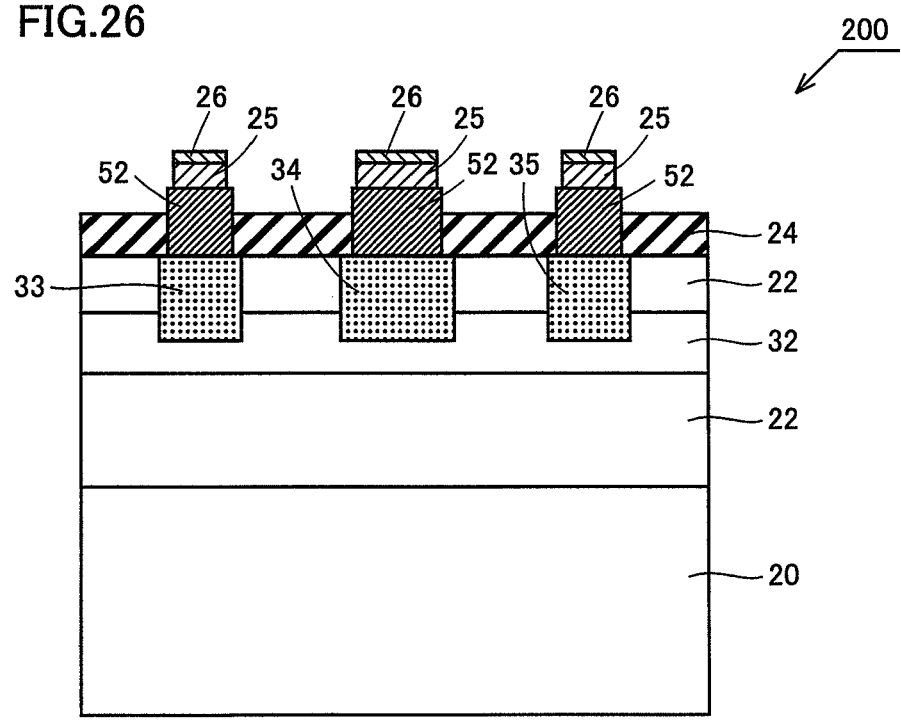
FIG. 26 is a schematic cross sectional view showing a state of the RESURF-JFET completed by performing step (S60) of FIG. 6.

FIG. 20-FIG. 26 are schematic cross sectional views respectively showing states after performing the steps in the case of forming a RESURF-JFET using the second embodiment of the present invention. More specifically, FIG. 20 is a schematic cross sectional view showing a state in which step (S10) of FIG. 6 has been performed to form the RESURF-JFET. FIG. 21 is a schematic cross sectional view showing a state in which step (S20) of FIG. 6 has been performed to form the RESURF-JFET. FIG. 22 is a schematic cross sectional view showing a state in which ion implantation has been performed to form the RESURF-JFET. FIG. 23 is a schematic cross sectional view showing a state in which a field oxide film is formed to form the RESURF-JFET. FIG. 24 is a schematic cross sectional view showing a state in which step (S45) of FIG. 6 has been performed to form the RESURF-JFET. FIG. 25 is a schematic cross sectional view showing a state in which step (S50) of FIG. 6 has been performed to form the RESURF-JFET. FIG. 26 is a schematic cross sectional view showing a state of the RESURF-JFET completed by performing step (S60) of FIG. 6. Referring to FIG. 20-FIG. 26, the following illustrates a method for manufacturing the RESURF-JFET using the second embodiment of the present invention.

First, as shown in FIG. 20, a SiC substrate 20 of n type is prepared, as step (S10) of preparing the substrate in FIG. 6, for example. Then, as step (S20) of forming the SiC layer of FIG. 6, a p$^+$ type epitaxial layer 22 (see FIG. 21) is formed on one main surface of SiC substrate 20. Further, an n$^+$ type epitaxial layer 32 (see FIG. 21) is formed on an opposite surface of p$^+$ type epitaxial layer 22 to its surface facing SiC substrate 20. Further, a p$^+$ type epitaxial layer 22 (see FIG. 21) is formed on the opposite surface of n' type epitaxial layer 32 to its surface facing p$^+$ type epitaxial layer 22. In this way, a stacked structure of p$^+$ type epitaxial layer 22, n$^+$ type epitaxial layer 32, and p$^+$ type epitaxial layer 22 is formed as shown in FIG. 21. P$^+$ type epitaxial layer 22 facing SiC substrate 20 has an impurity concentration of 2e17 cm$^{-3}$ and has a film thickness of 10 μm. N$^+$ type epitaxial layer 32 has an impurity concentration of 2e17 cm$^{-3}$ and has a film thickness of 0.4 μm. P$^+$ type epitaxial layer 22 that is the uppermost layer has an impurity concentration of 2e17 cm$^{-3}$ and has a film thickness of 0.2 μm.

Next, as shown in FIG. 22, P ions and Al ions are implanted into p$^+$ type epitaxial layer 22 that is the uppermost layer and n$^+$ type epitaxial layer 32, thereby forming a source region 33, a gate region 34, and a drain region 35. Each of the steps of forming source region 33 and drain region 35 is a step of forming a region having an impurity concentration greater by approximately two to three digits than the impurity concentration of n$^+$ type epitaxial layer 32 so as to attain a good electric contact between an ohmic electrode to be formed and the substrate. Further, the step of forming gate region 34 is a step of forming a region having an impurity concentration higher by approximately one to three digits than the impurity concentration of each of p$^+$ type epitaxial layer 22 and n$^+$ type epitaxial layer 32 in order to improve electric characteristics of a gate electrode for controlling a channel of the transistor to be formed. Here, in order to form source region 33 and drain region 35, P (phosphorus) ions are implanted at a dose of 6e14 cm$^{-2}$ by means of ion implantation. On the other hand, in order to form gate region 34, Al ions are implanted at a dose of 8e14 cm$^{-2}$. In order to provide a function as a RESURF-JFET, i.e., a function of uniformizing electric field strength distribution in a region between source region 33 and drain region 35 to restrain concentration of electric field, it is preferable that the depth of each of source region 33, gate region 34, and drain region 35 is deeper than the thickness of p$^+$ type epitaxial layer 22 that is the uppermost layer, and is shallower than the total thickness of p$^+$ type epitaxial layer 22 and n$^+$ type epitaxial layer 32, as shown in FIG. 22.

In order to form source region 33, gate region 34, and drain region 35 shown in FIG. 22, it is preferable to use, for example, both the photolithography method and the ion implantation method as with the case of forming Al ion implantation region 23 as shown in FIG. 14.

Here, in order to activate the impurity of each of source region 33, gate region 34, and drain region 35, activation annealing (thermal treatment) is performed at 1700° C. for 30 minutes. Thereafter, as shown in FIG. 23, a field oxide film 24 having a thickness of 100 nm and made of SiO$_2$ is formed on the main surfaces of p$^+$ type epitaxial layer 22, source region 33, gate region 34, and drain region 35 (upper side in FIG. 23) by thermal oxidation in, for example, wet atmosphere. This field oxide film is formed to protect the main surfaces of p$^+$ type epitaxial layer 22, source region 33, gate region 34, and drain region 35.

A mask having an opening pattern is formed on field oxide film 24 using, for example, the photolithography method. Etching or the like is performed using the mask to remove field oxide film 24 formed on source region 33, gate region 34, and drain region 35 at their main surfaces not facing p$^+$ type epitaxial layer 22. This exposes the main surfaces of source region 33, gate region 34, and drain region 35 which do not face p$^+$ type epitaxial layer 22. Then, in this state, as step (S30) of forming the first metal layer as shown in FIG. 6, a Ni thin film 36 having a thickness of, for example, 50 nm is formed on each of source region 33, gate region 34, and drain region 35 as shown in FIG. 24. Instead of Ni (nickel), for example, Al (aluminum), Ti (titanium), Pt (platinum), W (tungsten), Pd (palladium), or the like may be used. Next, as step (S40) of forming the Si layer as shown in FIG. 6, a Si layer 27 having a thickness of, for example, 100 nm is formed on a main surface of Ni thin film 36 as shown in FIG. 24. Next, as step (S45) of forming the second metal layer as shown in FIG. 6, a Ni thin film 36 having a thickness of 20 nm is formed on a main surface of Si layer 27 as shown in FIG. 24, for example. Instead of Ni (nickel), for example, Ti (titanium), Al (aluminum), Cr (chromium), or the like may be used.

In this state, as step (S50) of performing the thermal treatment as shown in FIG. 6, the entire structure shown in FIG. 24 is thermally treated at 1000° C. for 2 minutes. Accordingly, Ni of Ni thin film 36 serving as the first metal layer, Si of Si layer 27, and Ni of Ni thin film 36 serving as the second metal layer are silicided, thereby forming electrodes 52 each serving as a silicide layer as shown in FIG. 25. Each of electrodes 52 is an ohmic electrode. Electrode 52 may be configured in the form of a stack of the following individually formed regions: a region in which Ni thin film 36 serving as the first metal layer and Si of Si layer 27 are silicided; and a region in which Ni thin film 36 serving as the second metal layer and Si of Si layer 27 are silicided. Alternatively, electrode 52 may be configured as one silicide layer obtained by mixing and siliciding the three elements, i.e., Ni thin film 36 serving as the first metal layer, Si of Si layer 27, and Ni thin film 36 serving as the second metal layer. Alternatively, Ni thin film 36 not silicided may remain in electrode 52 at its surface layer not facing, for example, source region 33.

In step (S60) of forming the wire portion, a Ti thin film 25 having a thickness of 50 nm and an Al thin film 26 having a thickness of 3 nm are formed as a wire (pad) on the surface layer of electrode 52 serving as the ohmic electrode as shown in FIG. 26, for example.

RESURF-JFET 200 formed in accordance with the above-described procedure and shown in FIG. 26 has the ohmic electrodes (electrodes 52) each having the wire adhered thereto well by preventing deposition of carbon atoms on the surface layer of each electrode 52 and formation of a Schottky electrode by Si and SiC.

It should be noted that as the above-described method for forming each ohmic electrode in RESURF-JFET 200, the formation method in the second embodiment of the present invention has been exemplified. However, the method is not limited to this and the ohmic electrode may be formed using the formation method in another embodiment of the present invention, for example, the first, third, or fourth embodiment of the present invention. Using any one of the embodiments, each of electrodes 52 shown in each of FIG. 25 and FIG. 26 is formed from one or two silicide layers by siliciding Si and one or two metallic elements.

EXAMPLE 3

Figure 27:
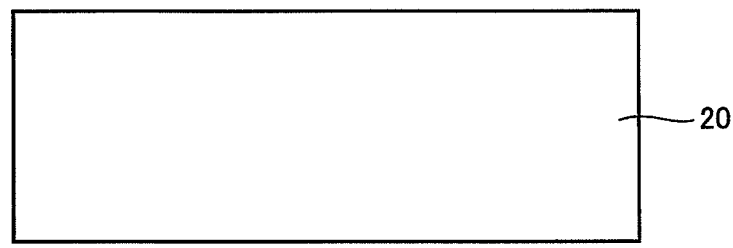
FIG. 27 is a schematic cross sectional view showing a state in which step (S10) of FIG. 6 has been performed to form the lateral type MOSFET.
Figure 28:
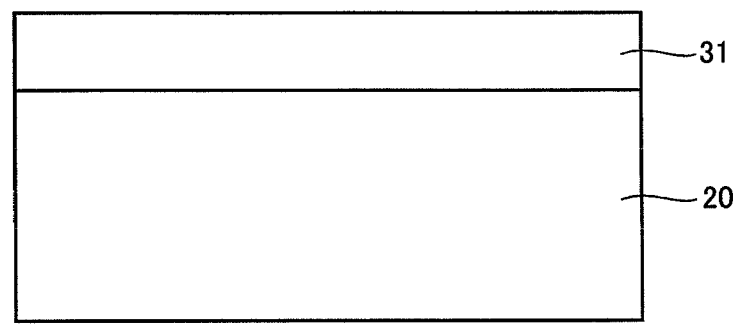
FIG. 28 is a schematic cross sectional view showing a state in which step (S20) of FIG. 6 has been performed to form the lateral type MOSFET.
Figure 29:
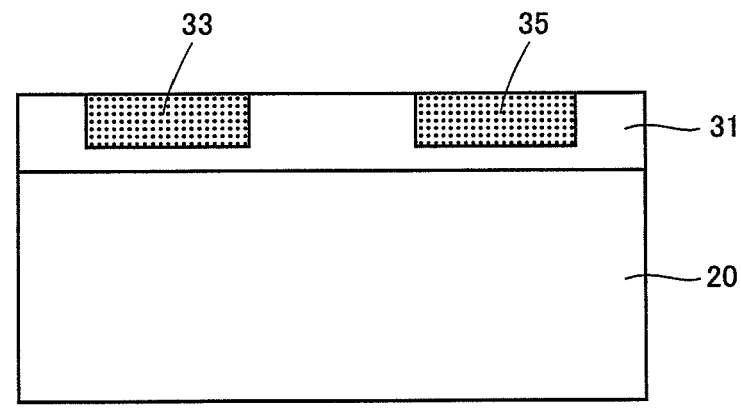
FIG. 29 is a schematic cross sectional view showing a state in which ion implantation has been performed to form the lateral type MOSFET.
Figure 30:
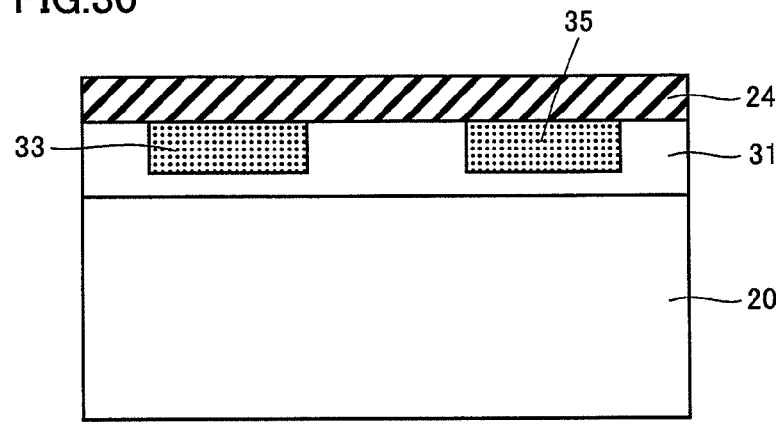
FIG. 30 is a schematic cross sectional view showing a state in which a field oxide film is formed to form the lateral type MOSFET.
Figure 31:
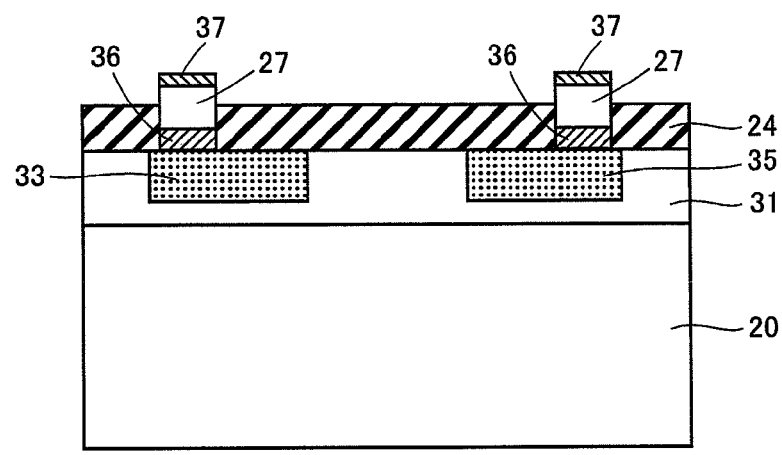
FIG. 31 is a schematic cross sectional view showing a state in which step (S45) of FIG. 6 has been performed to form the lateral type MOSFET.
Figure 32:
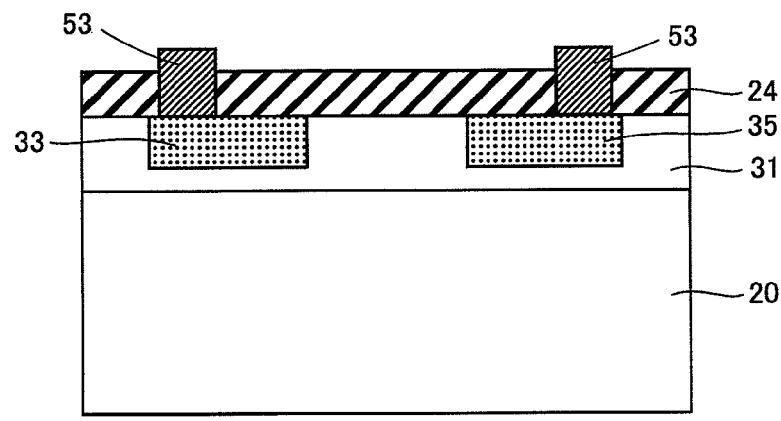
FIG. 32 is a schematic cross sectional view showing a state in which step (S50) of FIG. 6 has been performed to form the lateral type MOSFET.
Figure 33:
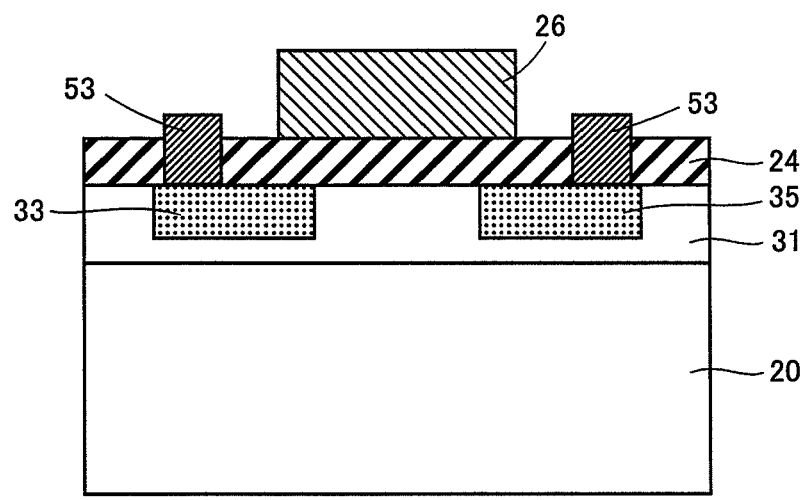
FIG. 33 is a schematic cross sectional view showing a state in which a gate electrode is formed to form the lateral type MOSFET.
Figure 34:
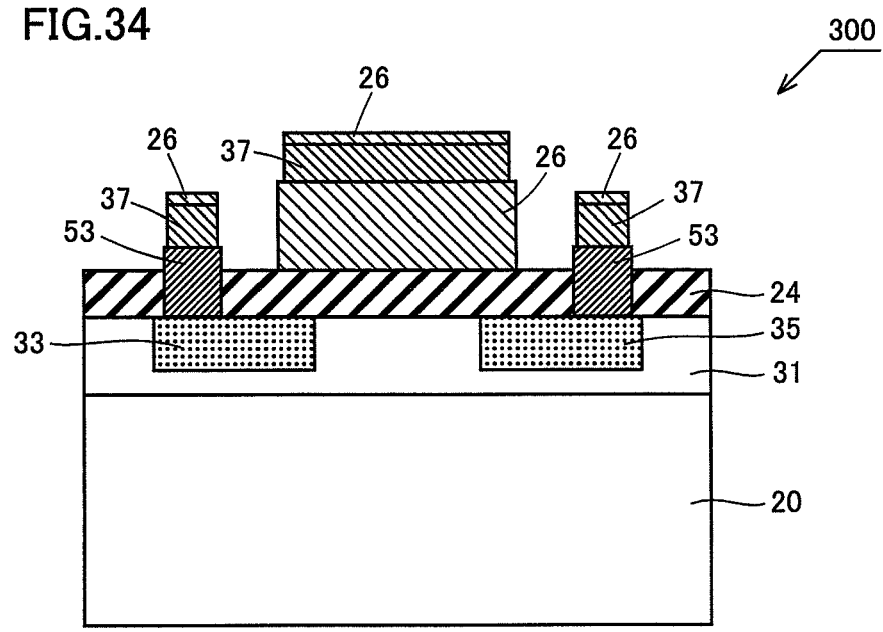
FIG. 34 is a schematic cross sectional view showing a state of the lateral type MOSFET completed by performing step (S60) of FIG. 6.

FIG. 27-FIG. 34 are schematic cross sectional views respectively showing states after performing the steps in the case of forming a lateral type MOSFET using the third embodiment of the present invention. More specifically, FIG. 27 is a schematic cross sectional view showing a state in which step (S10) of FIG. 6 has been performed to form the lateral type MOSFET. FIG. 28 is a schematic cross sectional view showing a state in which step (S20) of FIG. 6 has been performed to form the lateral type MOSFET. FIG. 29 is a schematic cross sectional view showing a state in which ion implantation has been performed to form the lateral type MOSFET. FIG. 30 is a schematic cross sectional view showing a state in which a field oxide film is formed to form the lateral type MOSFET. FIG. 31 is a schematic cross sectional view showing a state in which step (S45) of FIG. 6 has been performed to form the lateral type MOSFET. FIG. 32 is a schematic cross sectional view showing a state in which step (S50) of FIG. 6 has been performed to form the lateral type MOSFET. FIG. 33 is a schematic cross sectional view showing a state in which a gate electrode is formed to form the lateral type MOSFET. FIG. 34 is a schematic cross sectional view showing a state of the lateral type MOSFET completed by performing step (S60) of FIG. 6. Referring to FIG. 27-FIG. 34, the following illustrates a method for manufacturing the lateral type MOSFET using the third embodiment of the present invention.

First, as shown in FIG. 27, a SiC substrate 20 of n type is prepared as step (S10) of preparing the substrate in FIG. 6, for example. Then, as step (S20) of forming the SiC layer of FIG. 6, an p⁻ type epitaxial layer 31 is formed on one main surface of SiC substrate 20. Accordingly, p⁻ type epitaxial layer 31 can be formed as shown in FIG. 28. P⁻ type epitaxial layer 31 has an impurity concentration of 1e16 cm⁻³ and has a film thickness of 10 μm.

Next, as shown in FIG. 29, P ions are implanted into p⁻ type epitaxial layer 31, thereby forming a source region 33 and a drain region 35 each having n type conductivity. Each of the steps of forming source region 33 and drain region 35 is a step of forming a region having an impurity concentration greater by approximately two to three digits than the impurity concentration of p⁻ type epitaxial layer 31 so as to attain a good electric contact between an ohmic electrode to be formed and the substrate and so as to improve electric characteristics of the gate electrode for controlling a channel of the transistor to be formed. Here, in order to form source region 33 and drain region 35, P (phosphorus) ions are implanted by means of ion implantation at a dose of 5e14 cm⁻², for example. It should be noted that as shown in FIG. 29, the depth of each of source region 33 and drain region 35 is preferably shallower than the thickness of p⁻ type epitaxial layer 31.

In order to form source region 33 and drain region 35 shown in FIG. 29, it is preferable to use, for example, both the photolithography method and the ion implantation, as with Al ion implantation region 23 shown in FIG. 14.

Here, in order to activate the impurity of each of source region 33 and drain region 35, activation annealing (thermal treatment) is performed for 30 minutes at 1750° C. Thereafter, as shown in FIG. 30, a field oxide film 24 having a thickness of 50 nm and made of $SiO_2$ is formed on the main surfaces of p⁻ type epitaxial layer 31, source region 33, and drain region 35 (upper side in FIG. 30) by thermal oxidation in, for example, wet atmosphere. This field oxide film 24 is formed to have a portion located above a channel region and serving as a gate insulating film, and to protect the main surfaces of p⁻ type epitaxial layer 31, source region 33, and drain region 35.

A mask having an opening pattern is formed on field oxide film 24 using, for example, the photolithography method. Etching or the like is performed using the mask to remove portions of field oxide film 24 formed on source region 33 and drain region 35 at their main surfaces not facing p⁻ type epitaxial layer 31. This exposes the portions of the main surfaces of source region 33 and drain region 35 which do not face p⁻ type epitaxial layer 31. Then, in this state, as step (S30) of forming the first metal layer as shown in FIG. 6, a Ni thin film 36 having a thickness of, for example, 50 nm is formed in the region which is located on each of source region 33 and drain region 35 and from which field oxide film 24 has been removed, as shown in FIG. 31. Instead of Ni (nickel), for example, Al (aluminum), Ti (titanium), Pt (platinum), W (tungsten), Pd (palladium), or the like may be used. Next, as step (S40) of forming the Si layer as shown in FIG. 6, a Si layer 27 having a thickness of, for example, 100 nm is formed on a main surface of Ni thin film 36 as shown in FIG. 31. Next, as step (S45) of forming the second metal layer as shown in FIG. 6, a W thin film 37 having a thickness of, for example, 20 nm is formed on the main surface of Si layer 27 as shown in FIG. 31. Instead of W (tungsten), for example, Ti (titanium), Al (aluminum), Cr (chromium), or the like may be used.

In this state, as step (S50) of performing the thermal treatment as shown in FIG. 6, the entire structure shown in FIG. 31 is thermally treated at, for example, 1000° C. for 2 minutes. Accordingly, Ni of Ni thin film 36 serving as the first metal layer, Si of Si layer 27, and W of W thin film 37 serving as the second metal layer are silicided, thereby forming electrodes 53 each serving as a silicide layer as shown in FIG. 32. Each of electrodes 53 is an ohmic electrode, and may be configured in the form of a stack of the following individually formed regions: a region in which Ni thin film 36 serving as the first metal layer and Si of Si layer 27 are silicided; and a region in which W thin film 37 serving as the second metal layer and Si of Si layer 27 are silicided. Alternatively, electrode 53 may be configured as one silicide layer obtained by mixing and siliciding the three elements, i.e., Ni thin film 36 serving as the first metal layer, Si of Si layer 27, and W thin film 37 serving as the second metal layer. Alternatively, W thin film 37 not silicided may remain in electrode 53 at its surface layer not facing, for example, source region 33.

Next, a resist mask is formed using the photolithography method, for example. Thereafter, an Al film is formed as an electrically conductive film using vacuum deposition, ion beam deposition, or sputtering. Then, portions of the electrically conductive film other than a portion to be the gate electrode is removed (lifted off) together with the resist mask, thereby forming an Al thin film 26 on field oxide film 24 to serve as the gate electrode as shown in FIG. 33. Here, Al thin film 26 has a thickness of 200 nm, and is formed (over the channel region) to extend over source region 33 and drain region 35.

In step (S60) of forming the wire portion, a W thin film 37 having a thickness of 50 nm and an Al thin film 26 having a thickness of 3 nm are formed as a wire (pad) on the surface layer of each electrode 53 serving as the ohmic electrode as shown in FIG. 34, for example. It should be noted that W thin film 37 and Al thin film 26 are also formed in a similar way on Al thin film 26 serving as the gate electrode.

Lateral type MOSFET 300 formed in accordance with the above-described procedure and shown in FIG. 34 has the ohmic electrodes each having the wire adhered thereto well by preventing deposition of carbon atoms on the surface layer of electrode 53 and formation of a Schottky electrode by Si and SiC.

It should be noted that as the above-described method for forming each ohmic electrode in lateral type MOSFET 300, the formation method in the third embodiment of the present invention has been exemplified. However, the method is not limited to this and the ohmic electrode may be formed using the formation method in another embodiment of the present invention, for example, the first, second, or fourth embodiment of the present invention. Using any one of the embodiments, each of electrodes 53 shown in each of FIG. 32-FIG. 34 is formed from one or two silicide layers by siliciding Si and one or two metallic elements.

In addition, the embodiments of the present invention can be used not only for the lateral type MOSFET but also for a silicon carbide semiconductor device having an ohmic electrode, such as a vertical type MOSFET, a MESFET, or an IGBT.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

Industrial Applicability

The present invention is particularly excellent as an art, which is capable of providing a silicon carbide semiconductor device including an ohmic electrode allowing for better adhesion of a wire by preventing deposition of carbon so as not to make a Schottky contact.

Reference Signs List 10, 20, 95: SiC substrate; 10A, 10B, 10C, 10D: stacked structure; 11: SiC layer; 11A, 11B, 12A, 12B, 13B: ohmic electrode; 12: first metal layer; 13, 27: Si layer; 14: second metal layer; 15: Si metal layer; 21: n$^-$ type epitaxial layer; 22: p$^+$ type epitaxial layer; 23: Al ion implantation region; 24: field oxide film; 25: Ti thin film; 26: Al thin film; 31: p$^-$ type epitaxial layer; 32: n$^+$ type epitaxial layer; 33: source region; 34: gate region; 35: drain region; 36: Ni thin film; 37: W thin film; 41: carbon-containing silicide layer; 42, 43: silicide layer; 44: upper silicide layer; 51, 52, 53, 98: electrode; 94: Ni—Si alloy layer; 95A: electronic device; 96: wire; 97: carbon; 99: SiC semiconductor substrate; 99A: SiC semiconductor device; 100: pn diode; 200: RESURF-JFET; 300: lateral type MOSFET.

The invention claimed is:

1. A method for manufacturing a silicon carbide semiconductor device having an ohmic electrode, comprising the steps of:

forming a SiC layer made of silicon carbide;

forming a first metal layer on one main surface of said SiC layer, said first metal layer being made of one first metallic element and containing no carbon atoms;

forming a Si layer on an opposite surface of said first metal layer to its surface facing said SiC layer, said Si layer being made of silicon and containing no carbon atoms; and thermally treating said SiC layer, said first metal layer containing no carbon atoms, and said Si layer being formed on said first metal layer containing no carbon atoms with said Si layer being exposed, to form the ohmic electrode.

2. The method for manufacturing the silicon carbide semiconductor device according to claim 1, wherein in the step of thermally treating, a carbon-containing silicide layer made of an alloy of said one first metallic element and silicon and containing carbon atoms is formed on said one main surface of said SiC layer.

3. The method for manufacturing the silicon carbide semiconductor device according to claim 1, wherein said first metallic element is one element selected from a group consisting of nickel, titanium, aluminum, platinum, tungsten, and palladium.

4. A method for manufacturing a silicon carbide semiconductor device having an ohmic electrode, comprising the steps of:

forming a SiC layer made of silicon carbide;

forming a first metal layer on one main surface of said SiC layer, said first metal layer being made of one first metallic element and containing no carbon atoms;

forming a Si metal layer on an opposite surface of said first metal layer to its surface facing said SiC layer, said Si metal layer being made of silicon and said one first metallic element and containing no carbon atoms; and thermally treating said SiC layer, said first metal layer containing no carbon atoms, and said Si metal layer being formed on said first metal layer containing no carbon atoms with said Si metal layer being exposed, to form the ohmic electrode.

5. The method for manufacturing the silicon carbide semiconductor device according to claim 4, wherein in the step of thermally treating, a carbon-containing silicide layer made of an alloy of said one first metallic element and silicon and containing carbon atoms is formed on said one main surface of said SiC layer.

6. The method for manufacturing the silicon carbide semiconductor device according to claim 4, wherein said first metallic element is one element selected from a group consisting of nickel, titanium, aluminum, platinum, tungsten, and palladium.

7. A method for manufacturing a silicon carbide semiconductor device having an ohmic electrode, comprising the steps of:

forming a SiC layer made of silicon carbide;

forming a first metal layer on one main surface of said SiC layer, said first metal layer being made of one first metallic element and containing no carbon atoms;

forming a Si layer on an opposite surface of said first metal layer to its surface facing said SiC layer, said Si layer being made of silicon and containing no carbon atoms;

forming a second metal layer on an opposite surface of said Si layer to its surface facing said first metal layer, said second metal layer being made of one second metallic element and containing no carbon atoms; and thermally treating said SiC layer, said first metal layer, said Si layer, and said second metal layer with said second metal layer being exposed, to form the ohmic electrode.

8. The method for manufacturing the silicon carbide semiconductor device according to claim 7, wherein said second metal layer is one element selected from a group consisting of titanium, aluminum, and chromium.

9. The method for manufacturing the silicon carbide semiconductor device according to claim 7, wherein in the step of thermally treating, a carbon-containing silicide layer made of an alloy of said one first metallic element and silicon and containing carbon atoms is formed on said one main surface of said SiC layer.

10. The method for manufacturing the silicon carbide semiconductor device according to claim 7, wherein said first metallic element is one element selected from a group consisting of nickel, titanium, aluminum, platinum, tungsten, and palladium.

11. A method for manufacturing a silicon carbide semiconductor device having an ohmic electrode, comprising the steps of:
   forming a SiC layer made of silicon carbide;
   forming a first metal layer on one main surface of said SiC layer, said first metal layer being made of one first metallic element and containing no carbon atoms;
   forming a Si metal layer on an opposite surface of said first metal layer to its surface facing said SiC layer, said Si metal layer being made of silicon and said one first metallic element and containing no carbon atoms;
   forming a second metal layer on an opposite surface of said Si metal layer to its surface facing said first metal layer, said second metal layer being made of one second metallic element and containing no carbon atoms; and
   thermally treating said SiC layer, said first metal layer, said Si metal layer, and said second metal layer with said second metal layer being exposed, to form the ohmic electrode.

12. The method for manufacturing the silicon carbide semiconductor device according to claim 11, wherein said second metallic element is one element selected from a group consisting of titanium, aluminum, and chromium.

13. The method for manufacturing the silicon carbide semiconductor device according to claim 11, wherein in the step of thermally treating, a carbon-containing silicide layer made of an alloy of said one first metallic element and silicon and containing carbon atoms is formed on said one main surface of said SiC layer.

14. The method for manufacturing the silicon carbide semiconductor device according to claim 11, wherein said first metallic element is one element selected from a group consisting of nickel, titanium, aluminum, platinum, tungsten, and palladium.

* * * * *